(12) United States Patent
Fukui et al.

(10) Patent No.: US 12,411,426 B2
(45) Date of Patent: Sep. 9, 2025

(54) SUBSTRATE HOLDING BOARD, MANUFACTURING METHOD OF DEVICE, AND EXPOSURE DEVICE

(71) Applicant: CANON KABUSHIKI KAISHA, Tokyo (JP)

(72) Inventors: Shinji Fukui, Tochigi (JP); Toshinao Tatsuno, Tochigi (JP); Hideo Akiba, Tochigi (JP); Keiji Hirabayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 210 days.

(21) Appl. No.: 18/049,945

(22) Filed: Oct. 26, 2022

(65) Prior Publication Data

US 2023/0125632 A1    Apr. 27, 2023

(30) Foreign Application Priority Data

Oct. 27, 2021 (JP) .................................. 2021-175764
Jun. 23, 2022 (JP) .................................. 2022-101149

(51) Int. Cl.
G03F 7/00      (2006.01)
B32B 9/00      (2006.01)
B32B 38/08     (2006.01)

(52) U.S. Cl.
CPC .......... *G03F 7/70958* (2013.01); *B32B 9/007* (2013.01); *B32B 38/08* (2013.01); *G03F 7/70316* (2013.01); *B32B 2307/40* (2013.01); *B32B 2551/08* (2013.01)

(58) Field of Classification Search
CPC . B32B 2307/40; B32B 2551/08; B32B 38/08; B32B 9/007; G03F 7/70316; G03F 7/707; G03F 7/70941; G03F 7/7095; G03F 7/70958; H01L 21/6875; H01L 21/68757
See application file for complete search history.

(56) References Cited

U.S. PATENT DOCUMENTS

| | | | |
|---|---|---|---|
| 2002/0146532 A1 | 10/2002 | Honda et al. | |
| 2008/0264476 A1* | 10/2008 | Sharps | H01L 31/048 136/255 |
| 2009/0142599 A1 | 6/2009 | Dekempeneer et al. | |
| 2012/0088701 A1 | 4/2012 | Suzuki et al. | |
| 2017/0047221 A1* | 2/2017 | Harada | H01L 21/67092 |

(Continued)

FOREIGN PATENT DOCUMENTS

| | | |
|---|---|---|
| CN | 107287571 A | 10/2017 |
| JP | 2009046757 A | 3/2009 |

(Continued)

OTHER PUBLICATIONS

Machine translation of JP2009046757, Mar. 5, 2009.*
Machine translation of JP2015094002, May 18, 2015.*

*Primary Examiner* — Peter B Kim
(74) *Attorney, Agent, or Firm* — Canon U.S.A., Inc. IP Division

(57) ABSTRACT

A substrate holding board includes a first layer and a second layer forming an interfacial surface with the first layer. The first layer and the second layer contain diamond-like carbon. A refractive index of the first layer in a wavelength is higher than a refractive index of the second layer in the wavelength. A distance from the second layer to a topmost surface of the substrate holding board is smaller than a thickness of the first layer.

20 Claims, 10 Drawing Sheets

(56) References Cited

U.S. PATENT DOCUMENTS

| | | |
|---|---|---|
| 2018/0081284 A1 | 3/2018 | Lafarre |
| 2020/0217416 A1 | 7/2020 | Okazaki et al. |
| 2021/0104428 A1 | 4/2021 | Hirabayashi |

FOREIGN PATENT DOCUMENTS

| | | | | |
|---|---|---|---|---|
| JP | 2009539240 A | | 11/2009 | |
| JP | 2010239088 A | | 10/2010 | |
| JP | 2015094002 A | | 5/2015 | |
| JP | 3198796 U | | 7/2015 | |
| JP | 2017108053 A | * | 6/2017 | ........ H01L 21/02115 |
| JP | 2019522236 A | | 8/2019 | |
| JP | 2022085816 A | | 6/2022 | |
| KR | 20150120411 A | | 10/2015 | |
| KR | 20200031679 A | | 3/2020 | |
| KR | 20210039966 A | | 4/2021 | |
| WO | WO-2021249768 A1 | * | 12/2021 | ............. G03F 7/707 |

* cited by examiner

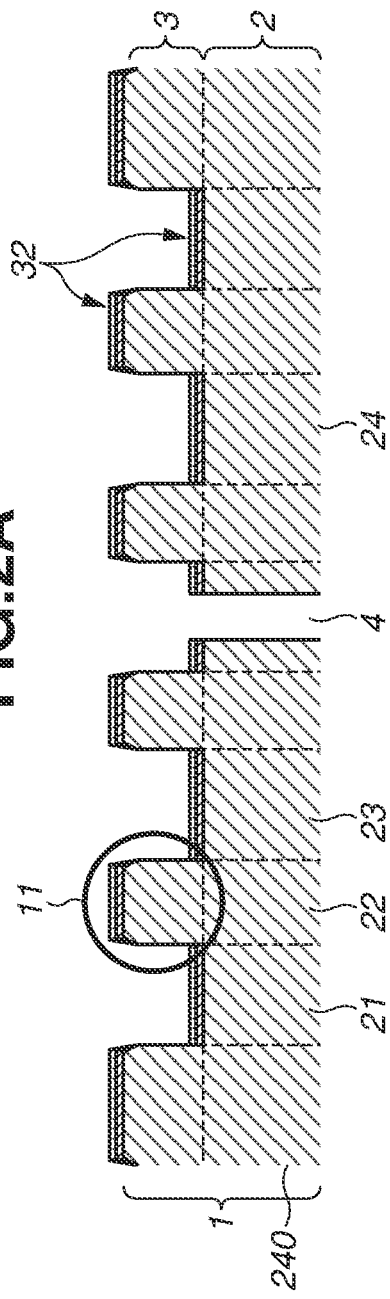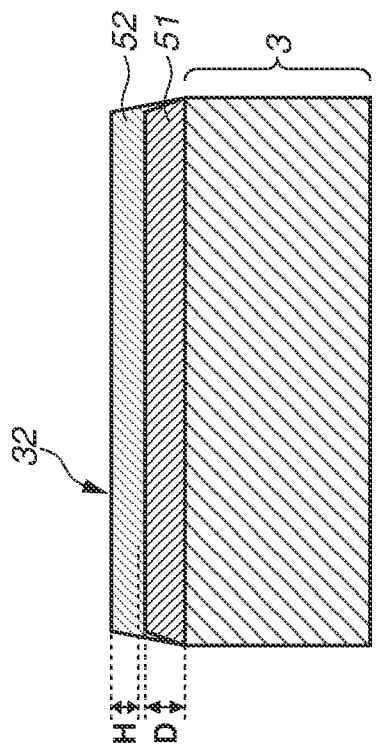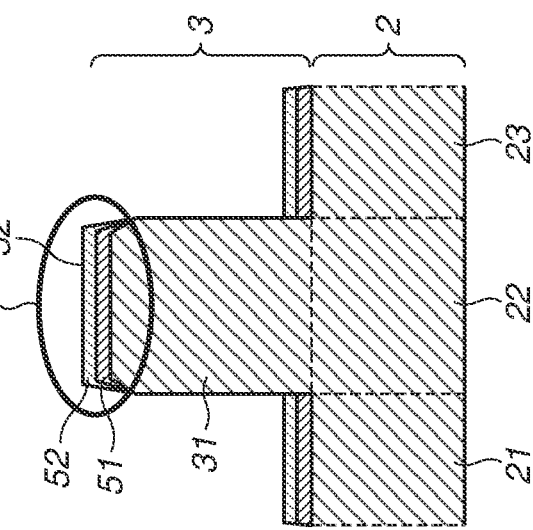

FIG.8

$$R = \left| \frac{N_3 - N_E}{N_3 + N_E} \right|^2$$

$$N_E = \frac{C}{B}$$

$$\begin{pmatrix} B \\ C \end{pmatrix} = \begin{pmatrix} \cos\delta & \dfrac{i\sin\delta}{N_2} \\ iN_2 \sin\delta & \cos\delta \end{pmatrix} \begin{pmatrix} 1 \\ N_1 \end{pmatrix}$$

$$\delta = \frac{2\pi N_2 d}{\lambda}$$

SUBSTRATE HOLDING BOARD, MANUFACTURING METHOD OF DEVICE, AND EXPOSURE DEVICE

BACKGROUND OF THE INVENTION

Field of the Invention

The present disclosure relates to a substrate holding board.

Description of the Related Art

Exposure devices perform exposure processing on a substrate including silicon, glass, and silicon carbide (SiC). As a trouble in these exposure devices, regions not to be exposed have been exposed to reflected light from a substrate holding board. Such a trouble is caused by an increase in reflectivity on the surface of a substrate holding board that is attributed to a worn installation surface of the substrate holding board repeatedly used over the years. In view of the foregoing, Japanese Patent Application Laid-Open No. 2015-94002 discusses a configuration in which a substrate holding board is coated with a diamond-like carbon (DLC) film, and the surface of the DLC film is coated with inorganic system coating agent. The DLC is a dielectric material and has a high electrical resistivity, and therefore a substrate and a substrate holding board are easily charged. If the substrate and the substrate holding board are charged, there has been concern that a circuit patterned on the substrate is broken due to discharge of accumulated electric charges. Japanese Unexamined Patent Application Publication No. 2009-539240 discusses a configuration for providing a conductive DLC coating doped with nitrogen, on a component supporting a substrate.

The substrate holding board discussed in Japanese Patent Application Laid-Open No. 2015-94002 has an disadvantage that an inorganic transparent thin film is easily peeled off, because adhesiveness between the DLC film and the inorganic system coating agent is insufficient.

In the configuration discussed in Japanese Unexamined Patent Application Publication No. 2009-539240, the DLC film may be oxidized when the surface of the substrate holding board is exposed to light such as ultraviolet light.

SUMMARY OF THE INVENTION

For the above reason, a first aspect of the present disclosure is to provide a substrate holding board with high peel resistance while suppressing a reflectivity on the surface of the substrate holding board.

For the above reason, a second aspect of the present disclosure is to suppress oxidization of the DLC film on the substrate holding board.

The present disclosure is also directed to improvement in optical characteristics of a substrate holding board through at least either the first or second aspect.

According to the first aspect of the disclosure, a substrate holding board includes a first layer and a second layer forming an interfacial surface with the first layer, wherein the first layer and the second layer contain diamond-like carbon, wherein a refractive index of the first layer in a wavelength is higher than a refractive index of the second layer in the wavelength, and wherein a distance from the second layer to a topmost surface of the substrate holding board is smaller than a thickness of the first layer.

According to the second aspect of the disclosure, a substrate holding board includes a first layer and a second layer forming an interfacial surface with the first layer, wherein the first layer contains diamond-like carbon, and the second layer contains a silicon carbide, wherein a refractive index of the first layer in a wavelength is higher than a refractive index of the second layer in the wavelength, and wherein a distance from the second layer to a topmost surface of the substrate holding board is smaller than a thickness of the first layer.

Further features of the present disclosure will become apparent from the following description of exemplary embodiments with reference to the attached drawings.

BRIEF DESCRIPTION OF THE DRAWINGS

FIG. 2A is a schematic diagram illustrating a substrate holding board according to a first exemplary embodiment. FIG. 2B is an enlarged view of a portion surrounded by a circle 11 illustrated in FIG. 2A. FIG. 2C is an enlarged view of a portion surrounded by a circle 12 illustrated in FIG. 2B.

FIG. 8 illustrates formulae explaining a theoretical value of a reflectivity.

DESCRIPTION OF THE EMBODIMENTS

Figure 1A:
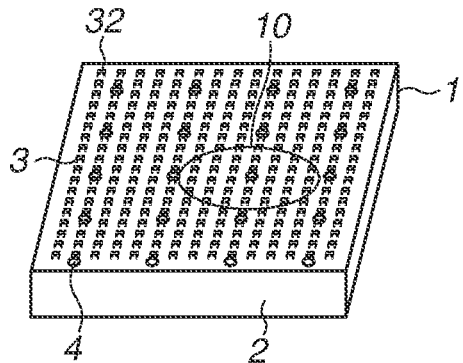
FIGS. 1A, 1B, 1C, 1D, and 1E are perspective views of a substrate holding board.

Hereinafter, exemplary embodiments of the present disclosure will be described with reference to the drawings. Each of the exemplary embodiments to be described below merely indicates one aspect of the disclosure, and the disclosure is not limited to these. In the following description and drawings, configurations common to a plurality of drawings are assigned common reference numerals. In addition, the common configurations will be described with reference to the plurality of drawings, and the description of the configurations assigned common reference numerals will be appropriately omitted.

FIG. 1A is a perspective view of a substrate holding board in a first example according to the present exemplary embodiment. The substrate holding board 1 according to the present exemplary embodiment includes a base portion 2, and a protruding portion 3 on the base portion 2. One surface (assumed to be a front surface for descriptive purposes) of two principal surfaces (front surface and rear surface) of the substrate holding board 1 is a topmost surface 32. The protruding portion 3 is provided on the side of the topmost surface 32 with respect to the base portion 2, but the protruding portion 3 can be omitted.

The topmost surface 32 is a surface that gets into contact with ambient atmosphere of the substrate holding board 1, among surfaces on the side on which a substrate 7 is placed, and needs not to be a surface that gets into contact with the substrate 7.

Figure 1C:
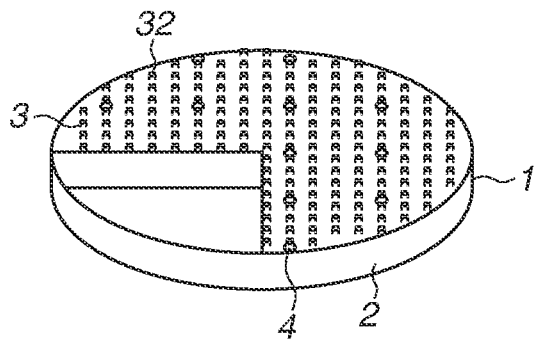
Figure 1B:
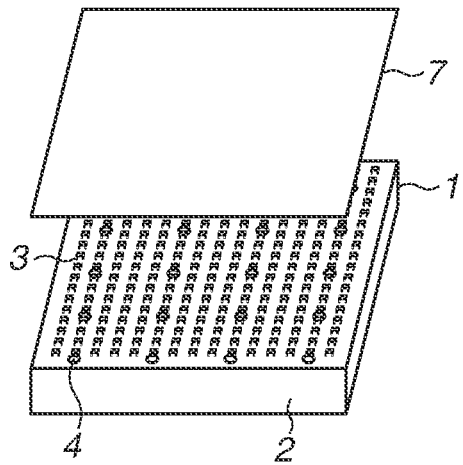

FIG. 1B is a perspective view of the substrate 7 to be placed on the substrate holding board 1 illustrated in FIG. 1A. The base portion 2, and the protruding portion 3 provided on the base portion 2 perform holding of the substrate 7. By the protruding portion 3 supporting the substrate 7, an area of contact between the substrate holding board 1 and the substrate 7 becomes smaller, and damages to the substrate 7 can be suppressed as compared with a case where the protruding portion 3 is not provided. The substrate 7 to be placed on the substrate holding board 1 in the first example is the substrate 7 to be used for manufacturing of an electronic device. The substrate 7 can constitute a part of an electronic device, but in some cases, the substrate 7 is removed during the manufacturing of an electronic device and is not included in the electronic device. The substrate 7 can be a glass substrate, a resin substrate, or a sapphire substrate that is to be used for manufacturing of an organic electroluminescence (EL) display, a liquid crystal display, or a solar cell panel, for example.

A suction hole 4 is provided on the substrate holding board 1 of this example, and vacuum contact of the substrate 7 is performed via the suction hole 4. The suction hole 4 may be omitted.

Figure 1D:
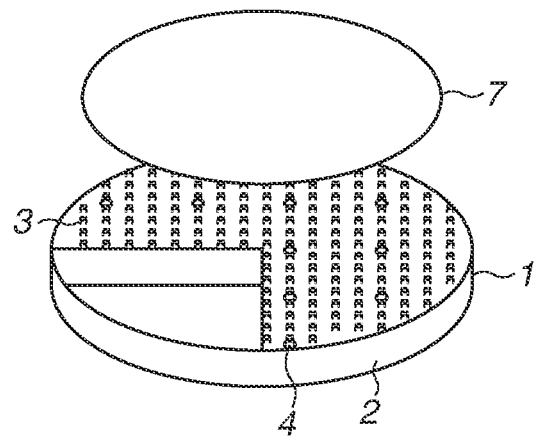

FIG. 1C is a perspective view of a substrate holding board 1 in a second example according to the present exemplary embodiment. FIG. 1D is a perspective view of the substrate 7 to be placed on the substrate holding board 1 of FIG. 1C. The substrate holding board 1 in the second example is different from the substrate holding board 1 illustrated in FIG. 1A in that an external form thereof is a circular form, but other configurations are the same. The substrate 7 to be placed on the substrate holding board 1 in the second example can be a semiconductor substrate, such as a silicone (Si) wafer or an SiC wafer, or an insulator substrate, such as a glass wafer, a plastic wafer, or sapphire.

The substrate holding board 1 illustrated in FIGS. 1A to 1D can be used in manufacturing apparatuses of various electronic devices. For example, the substrate holding board 1 can be used when the substrate 7 is held in an exposure device that exposes a photoresist applied onto the substrate 7. Apparatuses in which the substrate holding board 1 can be used are not limited to the exposure device, and the substrate holding board 1 can also be used for a coating device or an etching device.

Figure 1E:
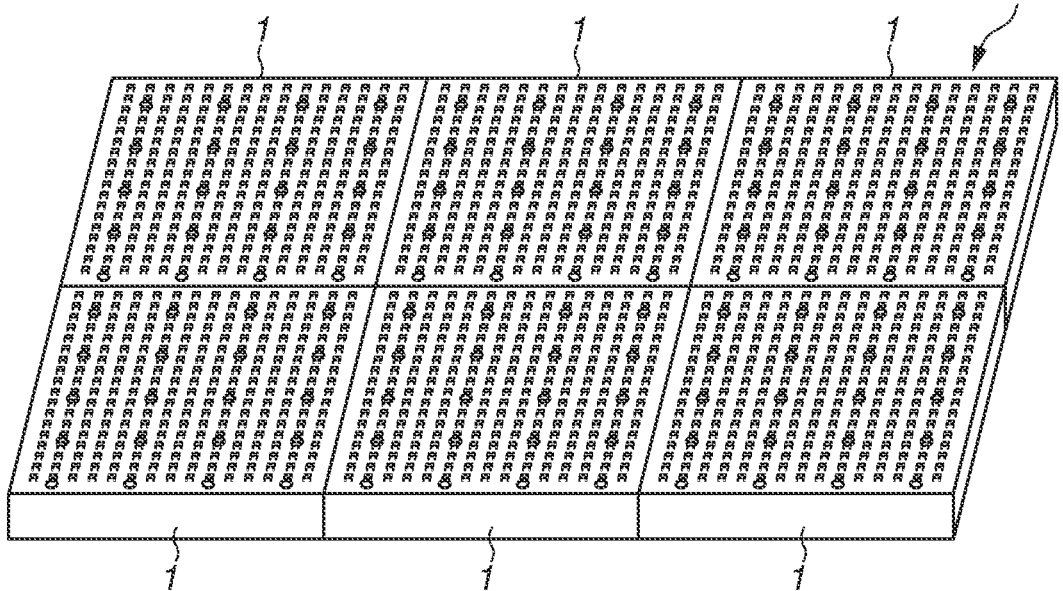

As illustrated in FIG. 1E, a plurality of substrate holding boards 1 can be arranged to be used as a substrate holding tool 111.

A first exemplary embodiment will now be described with reference to FIGS. 2A, 2B, and 2C.

FIG. 2A is an enlarged view of a range surrounded by a circle 10 illustrated in FIG. 1A or 1C. FIG. 2B is an enlarged view of a range surrounded by a circle 11 illustrated in FIG. 2A. FIG. 2C is an enlarged view of a range surrounded by a circle 12 illustrated in FIG. 2B.

The substrate holding board 1 of the present exemplary embodiment includes the base portion 2 and the protruding portion 3 as described in FIG. 1A or 1C. The top surface of the protruding portion 3 includes a coating layer 51 forming an interfacial surface with the protruding portion 3, and a coating layer 52 having a lower refractive index and a larger hydrogen content than those of the coating layer 51. The coating layer 51 and the coating layer 52 both contain DLC. The DLC is a material exhibiting an intermediate characteristic of the characteristics of diamond and graphite, each of which contains carbon as a major ingredient. The topmost surface 32 is formed by the coating layer 52 provided on the top surface of the protruding portion 3 and the top surface of the base portion 2. The protruding portion 3 can be omitted. In a case where the protruding portion 3 is omitted, the coating layer 51 is provided on the top surface of the base portion 2, and the coating layer 52 is provided on the top surface of the coating layer 51. In other words, in the present exemplary embodiment, the base portion 2 and the coating layer 51 form an interfacial surface, and the coating layer 51 and the coating layer 52 form an interfacial surface. In the present exemplary embodiment, two layers, which are the coating layer 51 and the coating layer 52, are stacked, but it is sufficient that the coating layer 51 and the coating layer 52 are closely-attached, and three or more layers may be included by providing another layer on or below the coating layer 51 or 52.

The base portion 2 will be described. The base portion 2 includes a component 21, a component 22, and a component 23. The component 21, the component 22, and the component 23 include the same materials. At least the components 21, 22, and 23 including common material will be referred to as base materials, and portions including the same material as the material will also be referred to as base materials. The components 21, 22, and 23 are positioned on the same plane. In addition, bottom surfaces of the component 21, 22, and 23 are positioned on the same plane, and constitute a rear surface 24 positioned on the opposite side of the topmost surface 32. The component 22 is positioned between the component 21 and the component 23. The coating layer 51 and the coating layer 52 may be provided on the component 21 and the component 23, respectively, and are preferably provided from the perspective of reflectivity reduction.

The protruding portion 3 will now be described. The protruding portion 3 is provided on the component 22 of the base portion 2. The protruding portion 3 is not provided above the component 21 and the component 23, and spaces are provided above the component 21 and the component 23. The protruding portion 3 exists between the space above the component 21 and the space above the component 23, and each of the spaces exists between two protruding portions 3.

The protruding portion 3 includes a component 31 containing the same material as the base portion 2. The coating layer 51 forming an interfacial surface with the protruding portion 3, and the coating layer 52 forming an interfacial surface with the coating layer 51 are provided on the top surface of the protruding portion 3. The component 31 contains the same material as the components 21, 22 and 23, and the component 31 constitutes a part of a base material.

The coating layer 51 and the coating layer 52 will now be described. In the present exemplary embodiment, the coating layer 51 and the coating layer 52 contain DLC. The coating layer 52 plays a role as an antireflection film if a refractive index of the coating layer 52 is set to be lower than a refractive index of the coating layer 51, and thereby a reflectivity of the coating layer 52 can be reduced. In addition, by stacking the coating layer 52 having a larger hydrogen content than that of the coating layer 51, material compatibility between the coating layer 51 and the coating layer 52 is improved, and peel resistance can be enhanced. From the perspective of peel resistance enhancement, air is preferably provided immediately above the coating layer 52. In other words, the coating layer 52 gets into contact with ambient atmosphere (for example, air or inactive gas) of the substrate holding board 1, and exists between the coating layer 51 and atmosphere. In a case where the substrate 7 is placed, the coating layer 52 provided on the protruding portion 3 gets into contact with the substrate 7 and holds the substrate 7.

The coating layer 52 exists within a distance H from the topmost surface 32, and the distance H is smaller than a thickness D of the coating layer 51 (i.e., D>H). In other words, the coating layer 52 exists closer to the topmost surface 32 than the coating layer 51. In the present exemplary embodiment, the distance H is 0, because the coating layer 52 forms the topmost surface 32.

From the perspective of a higher refractive index and a lower hydrogen content than those of the coating layer 52, the coating layer 51 is preferably tetrahedral amorphous-carbon (ta-C) or hydrogenated amorphous-carbon (a-C:H) having a low hydrogen content, among several types of DLC. From the perspective of a lower refractive index and a higher hydrogen content than those of the coating layer 51, the coating layer 52 is preferably a-C:H among types of DLC. A hydrogen concentration of ta-C is preferably smaller than 10 atomic percentage (at %), and is more preferably, smaller than 5 at %. A hydrogen concentration of a-C:H is preferably 10 at % or larger and smaller than 50 at %. More preferably, a hydrogen concentration of a-C:H is 21 to 26 at %. If the hydrogen content is 21 to 26 at %, good film quality (high hardness and high toughness) can be obtained in forming the coating layer 52. As a hydrogen concentration of DLC becomes higher, hardness of DLC becomes lower. Thus, in the present exemplary embodiment, the coating layer 51 has a higher hardness than that of the coating layer 52. Silicon contents of the coating layer 51 and the coating layer 52 are equal, and are preferably 0 at %.

The DLC can be defined by a ratio between an sp2 hybrid orbital and an sp3 hybrid orbital of carbon-carbon bond (C—C bond), and a hydrogen content. The ratio between an sp2 hybrid orbital and an sp3 hybrid orbital is 0.1 to 1.9 for ta-C, and 0.14 to 3.0 for a-C:H.

In the present exemplary embodiment, the coating layer 51 is, for example, a first layer, and the coating layer 52 is, for example, a second layer. The hardness of the coating layer 51 is preferably 20 gigapascal (GPa) or larger and 27 GPa or smaller, and the hardness of the coating layer 52 is preferably 10 GPa or larger and 20 GPa or smaller.

A ta-C film is formed by using physical vapor deposition (PVD) method such as arc ion plating. From the perspective of reduction in droplets (particles having diameters of several tens of nanometers (nm) to several micrometers (μm), which lead to degradation in flatness of films), filtered cathodic vacuum arc (FCVA) is more preferable among various types of arc ion plating.

An a-C:H film is formed by using a chemical vapor deposition CVD) method such as a plasma CVD method. A hydrogen content and a refractive index of DLC can be controlled based on a film formation condition, such as a flow rate of raw material gas or a substrate bias. A content of hydrogen in DLC can be analyzed by using elastic recoil detection analysis (ERDA). The DLC may contain argon. A refractive index of DLC can become lower as an argon content in DLC becomes higher, and thus argon has a beneficial effect on reflection suppression. An argon content in DLC may be smaller than 10 at %, and is preferably 1 at % or larger. Here, the unit of at % represents a content of an element and the unit is referred to as atom %. A content (concentration) of an element can be analyzed by using time-of-flight secondary ion mass spectrometry (TOF-SIMS).

A refractive index of the coating layer 51 is preferably 1.8 or larger and 3.0 or smaller, and is more preferably 2.0 or larger and 2.7 or smaller. A refractive index of the coating layer 52 is preferably 1.3 or larger and 2.5 or smaller, and is more preferably 1.6 or larger and 2.2 or smaller. The refractive index of the coating layer 52 is also set to a refractive index lower than that of the coating layer 51.

The thickness D of the coating layer 51 is a thickness for suppressing abrasion, and is preferably 500 nm or larger. If the thickness D becomes 10 μm or larger, a possibility of generation of cracks increases. Thus, the thickness D is preferably smaller than 10 μm.

A thickness of the coating layer 52 is preferably smaller than a thickness of the coating layer 51. The thickness of the coating layer 52 is preferably 10 nm or larger, and is more preferably 20 nm or larger. The thickness of the coating layer 52 is only required to be smaller than 500 nm, and is more preferably 250 nm or smaller.

A reflectivity on the surface of a substrate holding board will now be described. In an exposure device that forms a fine pattern, light rays with wavelengths of, for example, 365 nm (i-line), 405 nm (h-line), and 436 nm (g-line), are used. A theoretical value of a reflectivity R on the surface of a substrate holding board are obtained by four formulae illustrated in FIG. 8. Parameters in the formulae are defined as follows.

R: reflectivity
$N_3$: refractive index of air
$N_2$: complex refractive index of the coating layer 52 with respect to an exposure wavelength λ
$N_1$: complex refractive index of the coating layer 51 with respect to the exposure wavelength λ
$N_E$: complex refractive index obtained when the coating layer 51 and the coating layer 52 are regarded as a single layer
δ: phase difference
π: circumference ratio
d: thickness (nm) of the coating layer 52
λ: exposure wavelength (nm)
i: imaginary unit The complex refractive indices $N_1$ to $N_3$ are refractive indices considering absorption of light. The absorption of light is represented by an extinction coefficient. For example, a complex refractive index is 1.7-0.3i when a refractive index is 1.7 and an extinction coefficient is 0.3. The refractive index and the extinction coefficient can be measured by using, for example, an ellipsometry method. From the four formulae illustrated in FIG. 8, it can be seen that, if extinction coefficients of the coating layer 52 and the coating layer 51 are equal, setting a refractive index of the coating layer 51 to a refractive index larger than a refractive index of the coating layer 52 is advantageous for lowering reflectivity. From the perspective of lower reflectivity, a refractive index of the coating layer 51 is preferably 1.2 times or larger of a refractive index of the coating layer 52, and an upper limit needs not be provided, but is preferably 2.4 times or smaller, and is more preferably 2.0 times or smaller. By forming the coating layer 52 having a refractive index lower than that of the coating layer 51, the coating layer 52 plays a role as an antireflection film, and a reflectivity can be sufficiently reduced.

Material constituting the base material (the base portion 2 and the component 31) according to the present exemplary embodiment is black alumina. A thickness of the base material (the base portion 2 and the component 31) is a thickness to ensure a mechanical strength as the substrate holding board 1. The thickness of the base material is, for example, 10 to 100 mm, and is preferably 60 mm or smaller. The thickness of the base material (the base portion 2 and the component 31) may be 30 mm or smaller.

The material constituting the base material is not limited to black alumina, and may be, for example, alumina, ceramics, zirconia, glass, plastics, and metal.

The shape and an array pitch of the protruding portions 3 can support the substrate 7. For example, the protruding portions 3 are formed into a conical trapezoidal shape or a circular cylindrical shape. The pitch of the protruding portions 3 is, for example, 1 mm or larger and 100 mm or smaller and is preferably 10 mm or larger and 30 mm or smaller. The pitch of the protruding portion 3 may be 1 mm or larger and 10 mm or smaller. A height of the protruding portion 3 is, for example, 10 μm or larger and 1 mm or smaller. The height of the protruding portion 3 is preferably 0.2 mm or larger and 0.8 mm or smaller. The height of the protruding portion 3 may be, for example, 50 μm or larger and 0.5 mm or smaller, and may be 0.3 mm or smaller.

The suction hole 4 will now be described. To suck and hold the substrate 7 placed on the protruding portion 3, the suction hole 4 is connected to a vacuum pump (not illustrated) at a lower opening of the suction hole 4, and is enabled to suck ambient air of the protruding portion 3 to reduce the pressure. By providing the protruding portion 3, it is possible to suck a larger amount of air as compared with a case where the protruding portion 3 is not provided. In this example, the side surface of the suction hole 4 is coated with the coating layer 51, but the side surface is not a surface facing the substrate 7. Thus, the side surface may not be coated with the coating layer 51. Similarly, the coating layer 51 may not be coated on the rear surface 24 of the base portion 2 or on a side surface 240 of the base portion 2.

A second exemplary embodiment will now be described with reference to FIGS. 3A, 3B, and 3C. The present exemplary embodiment is different from the first exemplary embodiment in that the topmost surface 32 is formed by a coating layer 53.

Figure 3A:
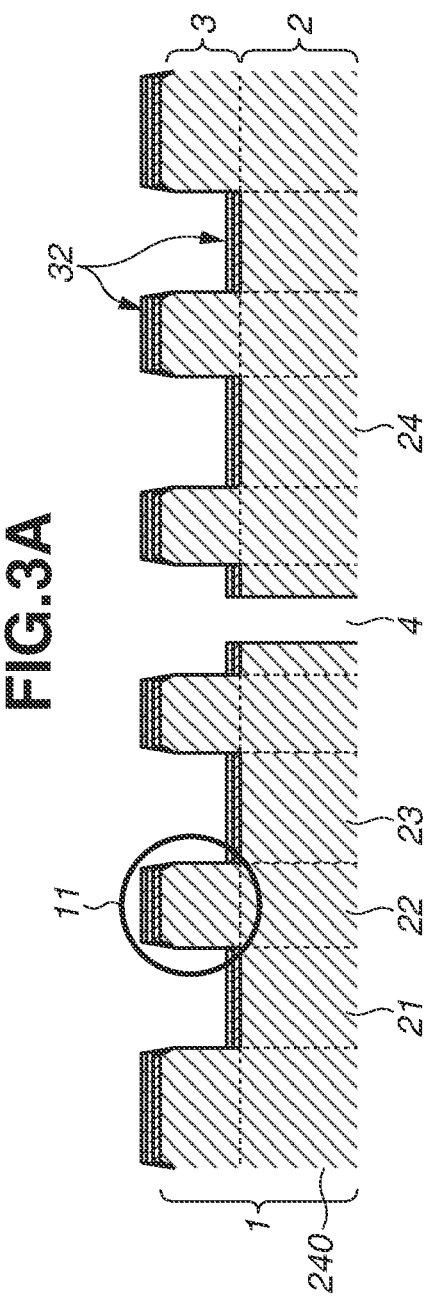
FIG. 3A is a schematic diagram illustrating a substrate holding board according to a second exemplary embodiment.

FIG. 3A is an enlarged view of a range surrounded by the circle 10 illustrated in FIG. 1A or 1C. FIG. 3B is an enlarged view of a range surrounded by a circle 11 illustrated in FIG. 3A. FIG. 3C is an enlarged view of a range surrounded by a circle 12 illustrated in FIG. 3B.

The coating layer 52 exists within the distance H from the topmost surface 32 formed by the coating layer 53, and the distance H is smaller than the thickness D of the coating layer 51. In the present exemplary embodiment, the coating layer 53 and the coating layer 52 constitute an interfacial surface, and the coating layer 52 and the coating layer 51 constitute an interfacial surface on an opposite side of the coating layer 53 when viewed from the coating layer 52. As in the present exemplary embodiment, one or a plurality of coating layers like the coating layer 53 may be provided on the coating layer 52 as long as D>H is satisfied.

Figure 3B:
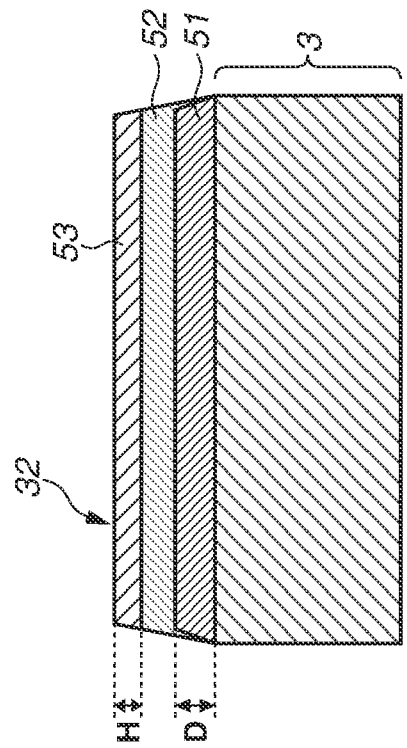
FIG. 3B is an enlarged view of a portion surrounded by a circle 11 illustrated in FIG. 3A.
Figure 3C:
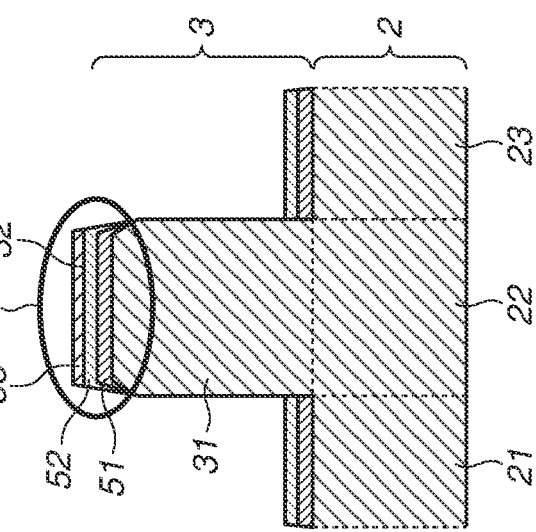
FIG. 3C is an enlarged view of a portion surrounded by a circle 12 illustrated in FIG. 3B.

In the present exemplary embodiment, as illustrated in FIGS. 3A to 3C, the coating layer 53 is provided on the top surface of the protruding portion 3, and the coating layers 51 and 52 are provided on the top surface of the base portion 2. However, the coating layer 53 may be provided on the top surface of the base portion 2. While the topmost surface 32 in the top surface of the protruding portion 3 is the coating layer 53, the topmost surface 32 in the top surface of the base portion 2 is the coating layer 52.

A refractive index of the coating layer 53 is preferably lower than a refractive index of the coating layer 52. With this configuration, it is possible to reduce a reflectivity on the surface on the substrate holding board 1 as compared with the first exemplary embodiment.

A third exemplary embodiment will now be described with reference to FIG. 4. The present exemplary embodiment is different from the first exemplary embodiment in that the protruding portion 3 is not included and the topmost surface 32 is a rough surface as compared with the first exemplary embodiment.

Figure 4A:
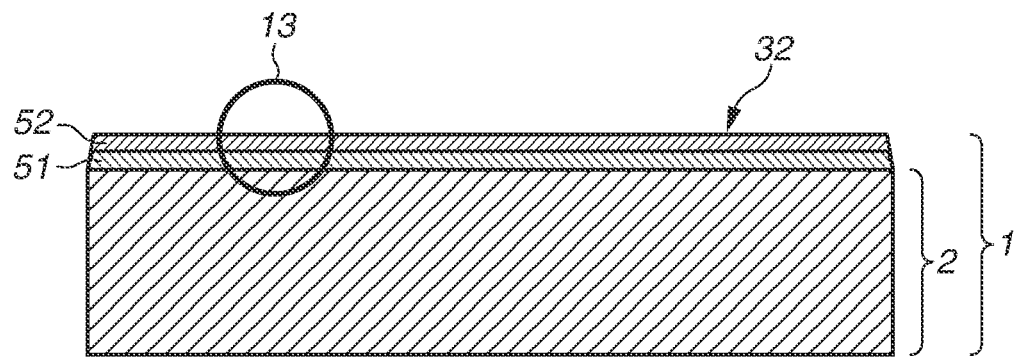
FIG. 4A is a schematic diagram illustrating a substrate holding board according to a third exemplary embodiment.
Figure 4B:
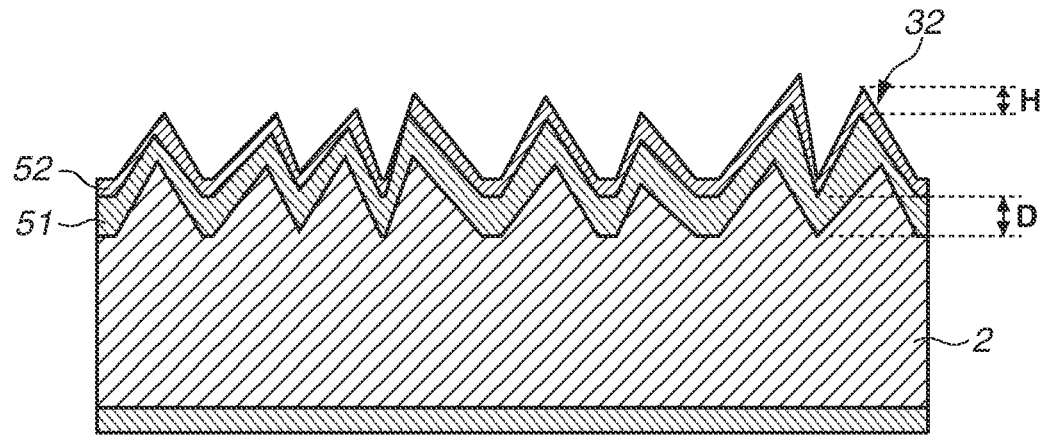
FIG. 4B is an enlarged view of a portion surrounded by a circle 11 illustrated in FIG. 4A.

FIG. 4A is a schematic diagram of the substrate holding board 1 according to the present exemplary embodiment. FIG. 4B is an enlarged view of a portion surrounded by a circle 13 illustrated in FIG. 4A.

If the topmost surface 32 is a rough surface, it is possible to reduce a reflectivity on the surface on the substrate holding board 1 when exposure processing is performed. With this configuration, a variation in emitted light intensity, and exposure unevenness can be suppressed.

If the surface of the base portion 2 is a rough surface, an interfacial surface between the coating layer 51 and the coating layer 52 that are formed on the surface of the base portion 2 can also similarly be a rough surface. In a case where the coating layer 53 is provided, an interfacial surface between the coating layer 52 and the coating layer 53 can also be a rough surface. It is most preferable that the topmost surface 32 is a rough surface, but it is sufficient that any one of these surfaces is a rough surface. In a case where the protruding portion 3 is provided, it is preferable that not only the topmost surface of the protruding portion 3 but also the top surface of the base portion 2 is a rough surface. It is thereby possible to increase adhesion force between the base portion 2 and the coating layer 51, and adhesion force between the coating layer 51 and the coating layer 52.

Moreover, a contact area with the substrate 7 is smaller as compared with a case where the topmost surface 32 is not a rough surface, and thus an effect of reducing damages to the substrate 7 is produced.

Also in a case where the topmost surface 32 is a rough surface, the coating layer 52 exists within the distance H from the topmost surface 32 and the distance H is smaller than the thickness D of the coating layer 51. The topmost surface 32 may not entirely satisfy D>H, and at least part of the topmost surface 32 may satisfy D>H. In the present exemplary embodiment, the coating layer 52 forms the topmost surface 32, and thereby the distance H is 0.

An arithmetic average roughness Ra of a rough surface is, for example, 0.4 μm or larger and 4.0 μm or smaller.

Also in the present exemplary embodiment, the coating layer 53 can also be provided as the topmost surface 32 similarly to the second exemplary embodiment.

A fourth exemplary embodiment will now be described. The substrate holding board 1 of the present exemplary embodiment is different in film composition from the substrate holding board 1 of the first exemplary embodiment, and therefore the substrate holding board 1 of the present exemplary embodiment will be described with reference to FIGS. 2A, 2B, and 2C. The present exemplary embodiment is different from the first exemplary embodiment in that the coating layer 52 is a silicon carbide. The coating layer 52 of the present exemplary embodiment contains silicon carbide, and a refractive index thereof is smaller than that of the coating layer 51 and a silicon content is larger than that of the coating layer 51. The coating layer 52 includes an SiC bond within the layer, and thereby the strength of the layer itself becomes high, and has good material compatibility with the coating layer 51 containing DLC. It is therefore possible to enhance peel resistance. The coating layer 52 may also contain hydrogen or oxygen aside from a silicon carbide. The coating layer 52 contains argon at a concentration of 1 at % or larger and 10 at % or smaller, and therefore the coating layer 52 has an effect also on the reduction in reflectivity. A film of the coating layer 52 is formed by using a PVD method, such as sputtering or a CVD method such as plasma CVD. From the perspective of a reduction in refractive index, it is preferable to use a CVD method.

In the present exemplary embodiment, a hydrogen content of the coating layer 52 is larger than that of the coating layer 51 if the coating layer 51 contains ta-C.

In the present exemplary embodiment, a refractive index of the coating layer 51 may be larger than that of the coating layer 52, and the coating layer 51 may contain ta-C or a-C:H among types of DLC. A silicon content of the coating layer 51 is 5% or smaller, and may be 0%.

In the present exemplary embodiment, a hardness of the coating layer 51 is preferably 10 GPa or larger and 27 GPa or smaller, and a hardness of the coating layer 52 is preferably a hardness smaller than that of the coating layer 51.

Figure 5A:
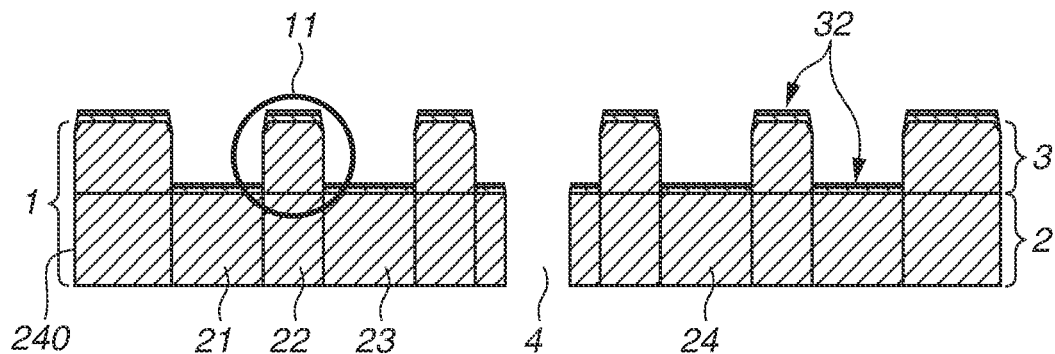
FIG. 5A is a schematic diagram illustrating a substrate holding board according to a fifth exemplary embodiment.
Figure 5B:
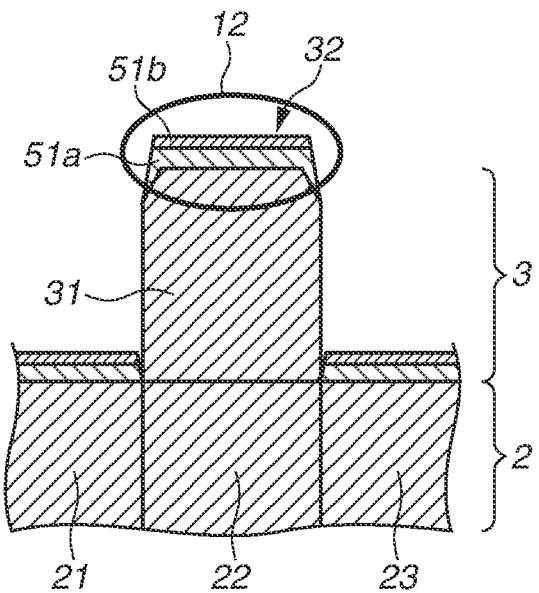
FIG. 5B is an enlarged view of a portion surrounded by a circle 11 illustrated in FIG. 5A.
Figure 5C:
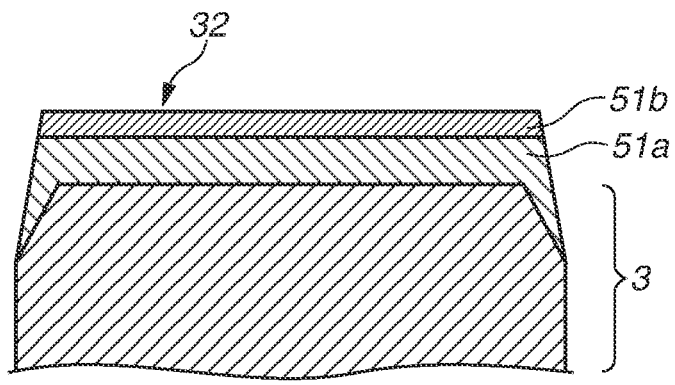
FIG. 5C is an enlarged view of a portion surrounded by a circle 12 illustrated in FIG. 5B.

A fifth exemplary embodiment will now be described with reference to FIGS. 5A, 5B, and 5C. FIG. 5A is an enlarged view of a range surrounded by the circle 10 illustrated in FIG. 1A. FIG. 5B is an enlarged view of a range surrounded by a circle 11 illustrated in FIG. 5A. FIG. 5C is an enlarged view of a range surrounded by a circle 12 illustrated in FIG. 5B.

The substrate holding board 1 of the present exemplary embodiment includes the base portion 2 and the protruding portion 3 as described with reference to FIG. 1A or 1C. On the top surface of the protruding portion 3, a coating layer 51a forming an interfacial surface with the protruding portion 3, and a coating layer 51b having a higher nitrogen concentration than that of the coating layer 51a are provided. The coating layer 51a and the coating layer 51b both contain DLC. The DLC is a material having an intermediate characteristic of the characteristics of diamond and graphite, each of which contains carbon as a major ingredient. There are several types of DLC, and examples of DLC include hydrogenated amorphous carbon (a-C:H) containing hydrogen by a concentration of 5 at % or larger and 50 at % or smaller, and tetrahedral amorphous carbon (ta-C) having a hydrogen concentration smaller than 5 at %. The hydrogen concentration indicates a percentage (hydrogen content) at which hydrogen is contained, in a case where the entire coating layer is assumed to be 100%. The topmost surface 32 is formed by the coating layer 51b provided on the top surface of the protruding portion 3 and the top surface of the base portion 2. The protruding portion 3 can be omitted. In a case where the protruding portion 3 is omitted, the coating layer 51a is provided on the top surface of the base portion 2, and the coating layer 51b is provided directly on the coating layer 51a. In other words, in the present exemplary embodiment, the base portion 2 and the coating layer 51a constitute an interfacial surface, and the coating layer 51b is provided directly on the coating layer 51a. In the present exemplary embodiment, two layers, which are the coating layer 51a and the coating layer 51b, are stacked, but it is sufficient that the coating layer 51a and the coating layer 51b are closely-attached, and another layer below the coating layer 51a may be provided to have three or more layers.

The base portion 2 will now be described. The base portion 2 includes a component 21, a component 22, and a component 23. The component 21, the component 22, and the component 23 include the same material. At least the components 21, 22, and 23 containing common material will be referred to as base materials, and portions containing the same material as the material will also be referred to as base materials. The components 21, 22, and 23 are positioned on the same plane. In addition, bottom surfaces of the components 21, 22, and 23 are positioned on the same plane to form a rear surface 24 located on the opposite side of the topmost surface 32. The component 22 is positioned between the component 21 and the component 23. The coating layer 51a and the coating layer 51b are preferably provided on the component 21 and the component 23, and the surface resistivity can be reduced.

The material constituting the base material may be ceramic, glass, plastics, metal, or the like, but ceramic is preferable. Examples of ceramic include alumina, black alumina, zirconia, silicon carbide, silicon nitride, and cordierite. To obtain an appropriate resistivity as a substrate holding board in a state where the coating layer 51a and the coating layer 51b are attached, the surface resistivity of the base material preferably falls within a range of 1.0E7 Ω/sq or larger and 1.0E10 Ω/sq or smaller. The appropriate surface resistivity as a substrate holding board falls within a range of 1.0E6 Ω/sq or larger and 5.0E9 Ω/sq or smaller. This is because, while charging is easily caused if the surface resistivity is high, charged electric charges are easily discharged (spark) if the surface resistivity is low.

The protruding portion 3 will now be described. The protruding portion 3 is formed on the component 22 of the base portion 2. The protruding portion 3 is not formed on the component 21 and the component 23, and spaces are provided above the component 21 and the component 23. The protruding portion 3 exists between the space above the component 21 and the space above the component 23, and each of the spaces is located between two protruding portions 3.

The protruding portion 3 includes a component 31 containing the same material as that of the base portion 2. The coating layer 51a forming an interfacial surface with the protruding portion 3, and the coating layer 51b forming an interfacial surface with the coating layer 51a are provided on the top surface of the protruding portion 3. The component 31 is formed by the same material as those of the components 21 to 23. The component 31 also forms part of a base material.

The shape and an array pitch of the protruding portions 3 can support the substrate 7. For example, the protruding portions 3 are formed into a conical trapezoidal shape or a circular cylindrical shape. The pitch of the protruding portions 3 is, for example, 1 mm or larger and 100 mm or smaller, and is preferably 1 mm or larger and 10 mm or smaller. A height of the protruding portion 3 is, for example, 10 μm or larger and 1 mm or smaller, and is preferably 0.1 mm or larger and 0.8 mm or smaller.

The suction hole 4 will now be described. To suck and hold the substrate 7 placed on the protruding portion 3, the suction hole 4 is connected to a vacuum pump (not illustrated) at a lower opening of the suction hole 4 to suck ambient air of the protruding portion 3 and reduce the pressure. By providing the protruding portion 3, a larger amount of air can be sucked. In this example, the side surface of the suction hole 4 is coated with the coating layer 51a, but the side surface is not a surface facing the substrate 7. Thus, the side surface may not be coated with the coating layer 51a. Similarly, the coating layer 51a may not be coated with the rear surface 24 of the base portion 2 or the side surface 240 of the base portion 2.

The coating layer 51a and the coating layer 51b will now be described. In the present exemplary embodiment, the coating layer 51 and the coating layer 52 include material containing DLC. By setting a nitrogen concentration of the coating layer 51b to a nitrogen concentration higher than a nitrogen concentration of the coating layer 51a, and setting a thickness of the coating layer 51b to a thickness of 5 nm or larger and 200 nm or smaller, high abrasion resistance and a low surface resistivity are achieved. Similarly, an effect of reducing the influence exerted on coating of oxidation (especially in ultraviolet exposure) can be obtained. Reasons thereof will be described in order.

The coating layer 51a and the coating layer 51b contain DLC and friction coefficients of these layers are lower than that of the ceramic contained in the base material, and thus frictional properties of the coating layer 51a and the coating layer 51b are lower than that of the ceramic. For this reason, shear stress applied onto the topmost surface 32 of the substrate holding board 1 when the substrate 7 is slid thereon is small, and therefore abrasion resistance becomes higher. Depending on the material of the base material, DLC is harder than the base material. Thus, an effect of enhancing abrasion resistance is also obtained.

If nitrogen is contained in DLC as an impure substance, a band gap becomes smaller, and thus a resistivity of DLC decreases. The inventor et al. have discovered that, if DLC containing nitrogen is 5 nm or larger, the surface resistivity can be decreased to such an extent that charging of the substrate holding board 1 can be suppressed.

Lastly, oxidation resistance will be described. As a nitrogen concentration of DLC becomes higher, bonding force in a film becomes weaker and oxidation resistance deteriorates. Thus, oxidation resistance of the coating layer 51b is lower than oxidation resistance of the coating layer 51a. In addition, oxidation caused by ultraviolet light gradually makes progress from a surface portion of a film toward an inner portion. In a case where the coating layer 51b is thicker than an entry depth of ultraviolet light, oxidation is caused up to a deep position in the coating layer 51b due to the influence of oxidation caused by ultraviolet exposure. In contrast, in a case where the coating layer 51b is thin enough, oxidation can be prevented from further making progress toward the inside of the film by the coating layer 51a existing below the coating layer 51b, even if the coating layer 51b is oxidized up to the lowermost portion by ultraviolet light. If the both cases above are compared, a thickness of the coating layer 51b oxidized in the latter case can be reduced. In other words, an effect of reducing the influence of oxidation caused by ultraviolet exposure can be obtained. A thickness of the coating layer 51b is preferably smaller than a depth at which light energy (square of amplitude of light) attenuate to ⅒. For example, a depth at which light energy attenuates to ⅒ when ultraviolet light having a wavelength of 365 nm enters DLC having an extinction coefficient of 0.33 is a depth of about 200 nm. Thus, if the thickness of the coating layer 51b is set to a thickness of 200 nm or smaller, oxidation resistance obtained when ultraviolet light is emitted can be enhanced when the coating layers 51a and 51b are considered to be one integrated layer. The thickness of the coating layer 51b is preferably smaller than a depth at which light energy attenuates to ½. For example, a depth at which light energy attenuates to ½ when ultraviolet light with a wavelength of 365 nm enters DLC with an extinction coefficient of 0.33 is a depth of about 60 nm. Thus, a thickness of the coating layer 51b is more preferably 60 nm or smaller. An extinction coefficient of DLC in a wavelength band of 200 to 400 nm can be regarded as being almost constant. By setting a thickness of the coating layer 51b to a thickness of 200 nm or smaller, it is possible to reduce the influence of oxidation caused by ultraviolet light corresponding to a j-line (313 nm) or a deep ultraviolet (DUV) region (200 to 300 nm) aside from an i-line (365 nm). If the coating layer 51b is oxidized, adverse influence, such as a reduction in abrasion resistance, a reduction in film thickness, and the occurrence of reflectivity unevenness, is caused. A state in which reflectivity unevenness has occurred is a state in which a reflectivity changes due to oxidation of part of the coating layer 51b, and a reflectivity in the substrate holding board 1 is not uniform. If a reflectivity is not uniform, an exposure result of the substrate 7 may become uneven as well. It is therefore preferable to form a coating layer of which a light reflectivity is likely to remain unchanged after ultraviolet exposure, from a light reflectivity obtained before ultraviolet exposure.

If an oxygen concentration in DLC increases, the number of C—C bonds is reduced, and DLC may be brittle. In other words, an oxidized layer increases in oxygen concentration, and the strength of DLC may decrease, but if the thickness of the coating layer 51b is 200 nm or smaller, a sufficient strength can be ensured. Furthermore, from analysis of actually-oxidized DLC, a range in which an oxygen concentration increases by 1 at % or more from an oxygen concentration obtained before ultraviolet exposure was a range of a depth of 30 nm from the surface. Thus, if a thickness of the coating layer 51b is 30 nm or smaller, a large effect can be obtained in maintaining a strength obtained by combining coating layers 51a and 51b.

A concentration of nitrogen contained in the coating layer 51a is preferably 0.2 at % or smaller, and a concentration of nitrogen contained in the coating layer 51b is preferably 1 at % or larger, but a concentration of nitrogen contained in the coating layer 51b is required to be larger than 0.2 at %. "A case where a nitrogen concentration of the coating layer 51b is higher than a nitrogen concentration of the coating layer 51a" includes a case where nitrogen is not included in the coating layer 51a. As a nitrogen concentration of the coating layer 51a becomes lower, higher oxidation resistance can be obtained. To obtain low resistivity even if the coating layer 51b is thin, a nitrogen concentration of the coating layer 51b needs to be 1 at % or larger. In addition, a nitrogen contained in the coating layer 51b is more preferably 3 at % or larger.

From the perspective of ensuring of abrasion resistance, a thickness of the coating layer 51a is preferably 0.1 μm or larger, and is preferably 5 μm or smaller in such a manner that peel-off attributed to film stress does not occur instead.

The coating layer 51b is preferably not a planar surface but a rough surface. The rough surface refers to a surface having an arithmetic average roughness Ra of 0.4 μm or larger and 4 μm or smaller. In a case where the coating layer 51b forms the topmost surface 32 of the substrate holding board 1, it is possible to reduce a reflectivity on the substrate holding board 1 by forming the topmost surface 32 into a rough surface. Not only the coating layer 51b but also the surface of the coating layer 51a that is on the side of the coating layer 51b, and the top surface of the protruding portion 3 may be rough surfaces. In a case where a refractive index of the coating layer 51b is higher than a refractive index of the coating layer 51a, an optical film thickness (physical film thickness×refractive index) of the coating layer 51b is preferably smaller than ¼ of a wavelength λ of light to be used (d×n<λ/4) from the perspective of suppression of reflection on the substrate holding board 1. If a wavelength of light to be used is 365 nm, and a refractive index of the coating layer 51b is about 2.1, a thickness (physical film thickness) of the coating layer 51b is preferably 40 nm or smaller. A refractive index of DLC with respect to light with a wavelength of 200 to 400 nm is 2.5 or smaller. In a case where a refractive index of the coating layer 51b is higher than a refractive index of the coating layer 51a, if a physical film thickness of the coating layer 51b×refractive index (2.5)<¼ of a wavelength (200 nm) of light is satisfied, d×n<λ/4 is satisfied when the wavelength is 200 nm or larger and the refractive index is 2.5 or smaller. That is, if the thickness of the coating layer 51b is smaller than 20 nm (=200 nm/(4×2.5)), light transmittance increases, and an effect of reflectivity reduction can be achieved. In a case where a refractive index of the coating layer 51b is lower than a refractive index of the coating layer 51a, irrespective of the thickness of the coating layer 51b, an effect of reflectivity reduction can be achieved as compared with a case where a refractive index of the coating layer 51b is higher than a refractive index of the coating layer 51a.

Figure 6A:
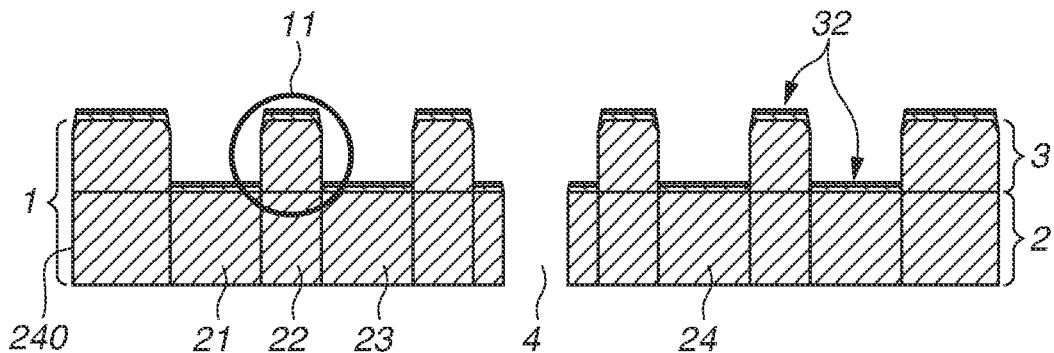
FIG. 6A is a schematic diagram illustrating a substrate holding board according to a sixth exemplary embodiment.
Figure 6B:
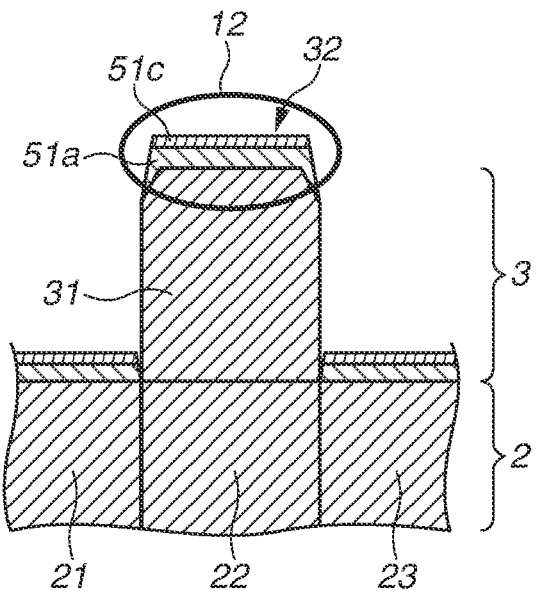
FIG. 6B is an enlarged view of a portion surrounded by a circle 11 illustrated in FIG. 6A.
Figure 6C:
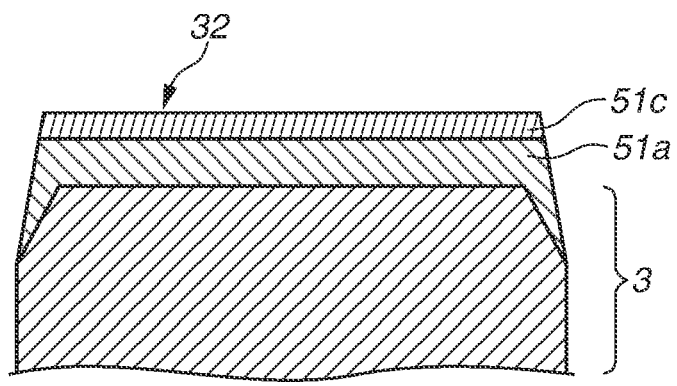
FIG. 6C is an enlarged view of a portion surrounded by a circle 12 illustrated in FIG. 6B.

The substrate holding board 1 according to a sixth exemplary embodiment will now be described with reference to FIG. 6. The present exemplary embodiment is different from the fifth exemplary embodiment in a configuration of a coating layer, and an external appearance of the substrate holding board 1 remains unchanged from that of the fifth exemplary embodiment. For this reason, the present exemplary embodiment will be described with reference also to FIGS. 1A, 1B, and 1C. FIG. 6A is an enlarged view of a range surrounded by a circle 10 illustrated in FIG. 1A or 1C. FIG. 6B is an enlarged view of a range surrounded by a circle 11 illustrated in FIG. 6A. FIG. 6C is an enlarged view of a range surrounded by a circle 12 illustrated in FIG. 6B.

The substrate holding board 1 according to the present exemplary embodiment is different from that of the fifth exemplary embodiment in that a coating layer 51c is provided on the side of the topmost surface 32 of the coating layer 51a. In the present exemplary embodiment, an interfacial surface is not provided between the coating layer 51a and the coating layer 51c, but the coating layer 51a and the coating layer 51c are represented as separated layers for descriptive purposes. The coating layer 51c is a layer containing DLC and having a nitrogen concentration inclined with respect to a thickness direction. The inclination of nitrogen concentration represents that a nitrogen concentration of the coating layer 51c becomes higher toward the topmost surface 32 side, and becomes lower toward the coating layer 51a side. In the present exemplary embodiment, the coating layer 51c is defined as a portion having a nitrogen concentration of 0.2 at % or larger, and the coating layer 51a is defined as a portion having a nitrogen concentration smaller than 0.2 at %. By inclining a nitrogen concentration in this manner, a resistivity can be further decreased more than that of the fifth exemplary embodiment. The reason thereof is considered as follows.

A film composition varies between the coating layer 51a and the coating layer 51b in the fifth exemplary embodiment, an interfacial surface is therefore formed between the coating layer 51a and the coating layer 51b. When the coating layer 51b grows after the interfacial surface is formed, at an earlier stage of growth, the coating layer 51b is estimated to grow into an island film instead of growing as a completely continuous film in an XY direction. In contrast, a nitrogen concentration of the coating layer 51c of the sixth exemplary embodiment continuously changes, and a nitrogen concentration does not drastically change between the coating layer 51a and the coating layer 51c. For this reason, an obvious interfacial surface is not formed in the sixth exemplary embodiment, and the film growth of the coating layer 51c is considered to make progress on an extended line of the coating layer 51a from an early stage of the growth. In other words, the coating layer 51c is considered to grow as a film continuous in the XY direction from the early stage. A film continuous in the XY direction conducts electricity in the XY direction more easily than an island film, and thus the surface resistivity in the sixth exemplary embodiment is lower than that in the fifth exemplary embodiment.

In addition, a refractive index gradually changes between the coating layer 51a and the coating layer 51c by a nitrogen concentration gradually decreasing, and thus an obvious interfacial surface at which a refractive index dramatically changes is not formed, and a reflectivity can also be reduced.

The coating layer 51c preferably includes a portion having a nitrogen concentration of 5 at % or larger and 30 at % or smaller, and the nitrogen concentration is more preferably 8 at % or larger and 20 at % or smaller. At the same time, the coating layer 51c preferably includes a portion having a nitrogen concentration of 3 at % or smaller, and the nitrogen concentration is more preferably 2 at % or smaller.

Figure 7:
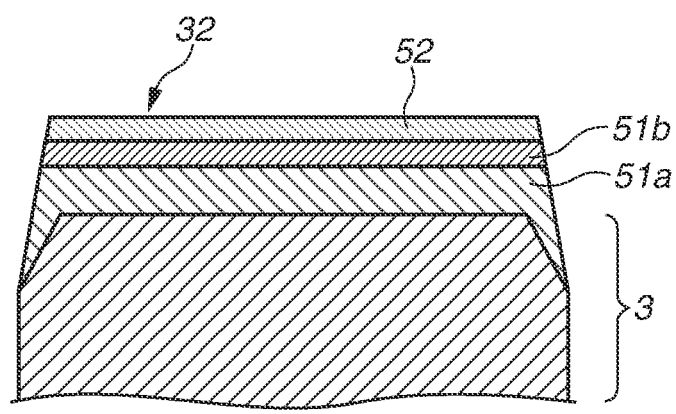
FIG. 7 is a schematic diagram illustrating a substrate holding board according to a seventh exemplary embodiment.

A substrate holding board 1 according to a seventh exemplary embodiment will now be described with reference to FIG. 7. The present exemplary embodiment is different from the second exemplary embodiment in a configuration of a coating layer, and an external appearance of the substrate holding board 1 remains unchanged from that of the second exemplary embodiment.

The substrate holding board 1 of the present exemplary embodiment is different from that of the fifth exemplary embodiment in that the coating layer 52 is provided on the coating layer 51b. The coating layer 52 preferably contains DLC having a lower refractive index as compared with the refractive index of the coating layer 51b. By providing the coating layer 52, a reflectivity on the substrate holding board 1 can be reduced. A layer provided on the coating layer 51b is not limited to the coating layer 52, and a layer provided on the coating layer 51b may be formed by a material having translucency. A thickness of the coating layer 52 is preferably 30 nm or larger and 200 nm or smaller, and is more preferably 50 nm or larger and 150 nm or smaller.

A surface of the coating layer 52 is preferably formed into a rough surface. If the coating layer 52 forming the topmost surface 32 has a rough surface, it is possible to reduce a reflectivity on the substrate holding board 1. An arithmetic average roughness Ra of the rough surface is, for example, 0.4 μm or larger and 4 μm or smaller. A layer of the coating layer 51b may be the coating layer 51c described in the sixth exemplary embodiment.

The present disclosure is not limited to the exemplary embodiments described above, and many modifications can be made within the technical concept of the present disclosure.

Figure 10:
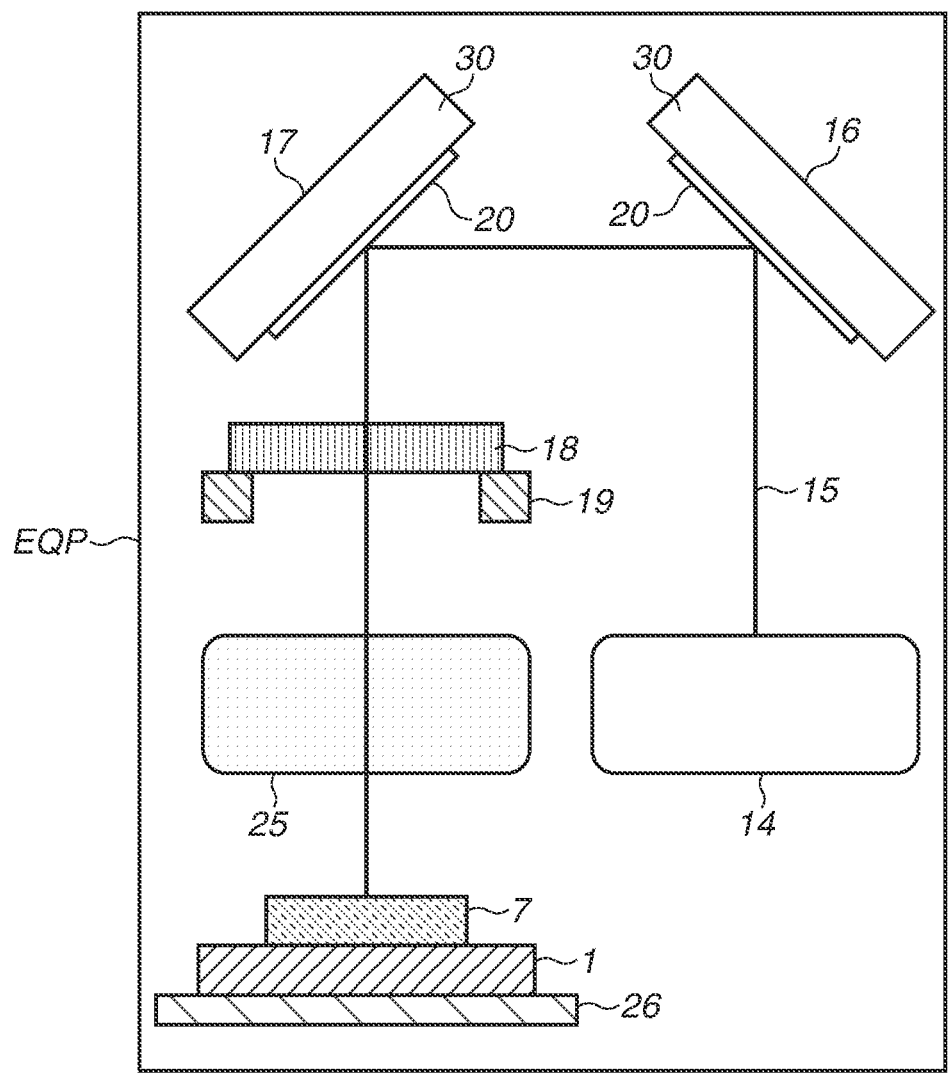
FIG. 10 is a schematic diagram illustrating an exposure device according to the present exemplary embodiment.

FIG. 10 is a schematic diagram of an exposure device. An optical device EQP, which is an exposure device, includes a light source 14, and mirrors 16 and 17 constituting an illumination optical system. The optical device EQP further includes a reticle stage 19 supporting a reticle 18 serving as a pattern forming unit, a projection optical system 25 that projects a pattern formed on the reticle 18, and the substrate holding board 1 supporting the substrate 7. Exposure light 15 from the light source 14 is reflected by the mirrors 16 and 17 of the illumination optical system, and guided to the reticle 18, and the exposure light 15 accompanied by the pattern formed on the reticle 18 is condensed to the projection optical system 25, and projected onto the substrate 7. The substrate 7 and the substrate holding board 1 are moved by a substrate moving unit 26, and the pattern formed on the reticle 18 is projected by the light source 14 onto the substrate 7. A photoresist is applied to the substrate 7, and the photoresist is exposed by the exposure light 15. The substrate 7 may be a semiconductor wafer, or may be a glass substrate for a flat panel display (FPD). Typically, exposure light of an exposure device is ultraviolet light. A wavelength of the exposure light is 436 nm if the light source 14 is a g-line light source, or about 365 nm if the light source 14 is an i-line light source. If the light source 14 is a KrF excimer laser light source, a wavelength of the exposure light is about 248 nm. If the light source 14 is an ArF excimer laser light source, the wavelength of the exposure light is about 193 nm. If the light source 14 is an extreme ultraviolet light (EUV) light source, the wavelength of the exposure light is 10 to 20 nm. Nevertheless, the wavelength of the exposure light is preferably 300 nm or larger and 400 nm or smaller while any of the above-described wavelengths is selectable. A projection optical system may be a reduced projection optical type, an equal magnification projection optical type, or an enlarged projection optical type. In this example, a transmission-type is exemplified for the reticle 18, but a reflection-type may be used. The projection optical system may be a refractive projection optical type using a transmission-type lens, or a reflection type using a mirror.

EXAMPLES

The present disclosure will now be described in detail based on examples. The following evaluation methods (1) to (3) were used as evaluation methods.
(1) Measurement of Refractive Index The manufactured substrate holding board 1 was measured with a spectroscopic ellipsometry (product name: EC-400 manufactured by J. A. Woollam). Refractive indices of the coating layer 51 and the coating layer 52 with respect to 365 nm (i-line wavelength) were obtained, and a refractive index ratio was calculated by dividing the refractive index of the coating layer 51 by the refractive index of the coating layer 52.
(2) Evaluation of Reflectivity A reflectivity of the manufactured substrate holding board 1 with respect to a wavelength of 365 nm was measured by a spectrophotometric colorimeter (CM-26d manufactured by KONICA MINOLTA, INC.). The spectrophotometric colorimeter cannot measure by a reflectivity with respect to the wavelength of 365 nm, an average of reflectivities with respect to a wavelength of 360 nm and a wavelength of 370 nm was used as the reflectivity with respect to the wavelength of 365 nm.
(3) Evaluation of Peel Resistance of the Coating Layer 52 with Respect to the Coating Layer 51

After the substrate holding board 1 on which the coating layer 52 was formed was swept with cleaning paper, the substrate holding board 1 was measured by a spectrophotometric colorimeter (CM-26d manufactured by KONICA MINOLTA, INC.), and evaluated based on the following standard. Sweeping with cleaning paper was performed by causing cleaning paper containing ethanol, to reciprocate ten times with load of 500 g/cm$^2$. A difference in reflectivity between before and after sweeping was evaluated.

Example 1-1

The substrate holding board 1 manufactured in Example 1-1 will now be described with reference to FIGS. 2A, 2B, and 2C. As the base portion 2 of the substrate holding board 1, black alumina with a thickness of 60 mm was used. The shape of the protruding portion 3 was a conical trapezoidal shape or a circular cylindrical shape having a diameter 0.8 mm and a height of 0.5 mm. A pitch of adjacent protruding portions 3 was 20 mm. The coating layer 51 was formed by the FCVA, and at least the surface of the protruding portion 3 was coated with ta-C in such a manner that a thickness became 500 nm. Conditions for ta-C film formation by the FCVA include a pressure of 0.03 Pa and arc current of 35 amperes (A), and a carbon target was used as a target. The coating layer 52 was formed by the plasma CVD, and at least the surface of the protruding portion 3 was coated with a-C:H in such a manner that a thickness became 35 nm. Conditions for film formation of the coating layer 52 by the plasma CVD included an argon gas flow rate of 50 sccm, a toluene gas flow rate of 2.5 sccm, a pressure of 5 Pa, and RF power of 300 watts (W).

A result of Example 1-1 was obtained as follows.

Refractive index ratio: 1.24

Difference between reflectivity before sweeping and reflectivity after sweeping: 0%

Example 1-2

The substrate holding board 1 was manufactured similarly to Example 1-1 except that the surface was coated in such a manner that a thickness of the coating layer 52 became 40 nm, and a condition for a-C:H film formation by the plasma CVD includes a pressure of 1 Pa.

A result of Example 1-2 was obtained as follows.

Refractive index ratio: 1.21

Difference between reflectivity before sweeping and reflectivity after sweeping: 0%

Example 1-3

The substrate holding board 1 was manufactured similarly to Example 1-1 except that the coating layer 52 contains a silicon carbide as a major ingredient, and the surface was coated in such a manner that a thickness became 25 nm. The layer containing a silicon carbide as a major ingredient was manufactured by the plasma CVD. Conditions for film formation of the coating layer 52 by the plasma CVD are conditions for a method similar to that in Example 1-1.

A result of Example 1-3 was obtained as follows.

Refractive index ratio: 1.48

Difference between reflectivity before sweeping and reflectivity after sweeping: 0%

Example 1-4

The substrate holding board 1 was manufactured similarly to Example 1-3 except that the surface was coated in such a manner that a thickness of the coating layer 52 became 65 nm.

A result of Example 1-4 was obtained as follows.
Refractive index ratio: 1.48
Difference between reflectivity before sweeping and reflectivity after sweeping: 0%

Example 1-5

The substrate holding board 1 was manufactured similarly to Example 1-3 except that the surface was coated by the plasma CVD to form an a-C:H film as the coating layer 51, and the surface was coated in such a manner that a thickness of the coating layer 52 became 20 nm. Conditions for film formation of the coating layer 51 by using the plasma CVD include an argon gas flow rate of 50 sccm, a toluene gas flow rate of 2.5 sccm, and a pressure of 5 Pa, and RF power of 300 W.

A result of Example 1-5 was obtained as follows.
Refractive index ratio: 1.20
Difference between reflectivity before sweeping and reflectivity after sweeping: 0%

Example 1-6

The substrate holding board 1 was manufactured similarly to Example 1-5 except that the surface was coated in such a manner that a thickness of the coating layer 52 became 70 nm.

A result of Example 1-6 was obtained as follows.
Refractive index ratio: 1.20
Difference between reflectivity before sweeping and reflectivity after sweeping: 0%

Comparative Example 1-1

The substrate holding board 1 was manufactured similarly to Example 1-5 except that the coating layer 52 was replaced with an inorganic particle film, and the surface was coated with the inorganic particle film in such a manner that a thickness became 60 nm. The inorganic particle film was formed by spray coating using inorganic particle dispersion liquid. Conditions for film formation by spray coating include a liquid supplied amount of 7 g/min, a spray gun moving speed of 20 m/min, and an atomization pressure of 0.1 MPa. An inorganic particle concentration of coating liquid was 0.4 weight percents (wt %).

A result of Example 1-6 was obtained as follows.
Refractive index ratio: 2.08
Difference between reflectivity before sweeping and reflectivity after sweeping: 10%

Results obtained for the substrate holding boards 1 in Examples and Comparative Example are shown in Table 1.

TABLE 1

| | Material of coating layer 51 (film thickness of 250 nm) | Coating layer 52 | | |
|---|---|---|---|---|
| | | Refractive index of coating layer 51 | Material | Film thickness d (nm) | Refractive index |
| Example 1-1 | ta-C | 2.57 | a-C:H | 35 | 2.07 |
| Example 1-2 | ta-C | 2.57 | a-C:H | 40 | 2.07 |
| Example 1-3 | ta-C | 2.57 | SiC | 25 | 1.73 |
| Example 1-4 | ta-C | 2.57 | SiC | 65 | 1.73 |
| Example 1-5 | a-C:H | 2.07 | SiC | 20 | 1.73 |
| Example 1-6 | a-C:H | 2.07 | SiC | 70 | 1.73 |
| Comparative Example 1-1 | a-C:H | 2.07 | Inorganic silica | 60 | 1.24 |

TABLE 1-continued

| | Peel resistance evaluation of second layer | | |
|---|---|---|---|
| | Refractive index ratio | Reflectivity before sweeping (%) @365 nm | Reflectivity after sweeping (%) @365 nm |
| Example 1-1 | 1.24 | 9.6 | 9.6 |
| Example 1-2 | 1.21 | 9.7 | 9.7 |
| Example 1-3 | 1.48 | 9.1 | 9.1 |
| Example 1-4 | 1.48 | 6.8 | 6.8 |
| Example 1-5 | 1.2 | 8.3 | 8.3 |
| Example 1-6 | 1.2 | 7.8 | 7.8 |
| Comparative Example 1-1 | 2.08 | 3.2 | 13.2 |

Evaluation of Examples and Comparative Example

In Examples 1-1 to 1-6, a difference between a reflectivity before sweeping and a reflectivity after sweeping of the coating layer 52 was 0%, and the substrate holding board 1 including the coating layer 52 having good peel resistance was obtained.

In contrast to this, in Comparative Example 1-1, the material of the coating layer 52 was inorganic silica, and thereby material compatibility with the coating layer 51 was not preferable, the film was peeled off from sweeping, and a reflectivity increased by 10%.

By forming, as the coating layer 52, an a-C:H film having, as a major ingredient, a larger hydrogen content than that of the coating layer 51, or a layer containing a silicon carbide having a larger Si content than that of the coating layer 51, peel resistance of the coating layer 52 was improved.

It was shown that the substrate holding boards 1 of Examples are superior to the substrate holding board of Comparative Example in peel resistance of the coating layer 52.

Examples 2-1 to 2-7 and Comparative Examples 2-1 and 2-2 will now be described. The following evaluation methods (1) to (4) were used as evaluation methods.

(1) Measurement of Surface Resistivity

The surface resistivity of the manufactured substrate holding board 1 was measured with Hiresta (MCP-HT450 manufactured by Nittoseiko Analytech). A probe that was used is a ring probe (MCP-HTP12), and a voltage applied in measurement was 500 V.

(2) Analysis of Element Concentration in DLC

Element analysis of the coating layer 51a, and the coating layer 51b or 51c of the manufactured substrate holding board 1 was performed with an X-ray photoelectron spectroscopy (XPS) (QuanteraII manufactured by ULVAC-PHI). As a "content percentage of nitrogen" in this specification, an atom content percentage of N that is obtained in a case where a total of atom content percentages of C, N, and O is 100 was used.

(3) Measurement of Reflectivity

A reflectivity of the manufactured substrate holding board 1 with respect to light of 365 nm wavelength was measured with a spectrophotometric colorimeter (CM-26d manufactured by KONICA MINOLTA, INC.).

(4) Measurement of Refractive Index

The manufactured substrate holding board 1 was measured with a spectroscopic ellipsometry (EC-400 manufactured by J.A. Woollam), and a refractive index with respect to light of 365 nm wavelength was obtained.

Examples 2-1 to 2-3

The substrate holding board 1 manufactured in Examples 2-1 to 2-3 will now be described with reference to FIGS. 5A, 5B, and 5C. As the base portion 2 of the substrate holding board 1, black alumina with a thickness of 60 mm was used. The shape of the protruding portion 3 was a circular cylindrical shape having a diameter 0.8 mm and a height of 0.5 mm. A pitch of adjacent protruding portions 3 was 20 mm. The surface resistivity of the substrate holding board 1 containing black alumina was 1.1E9 Ω/sq.

The coating layer 51a was hydrogenated amorphous-carbon (a-C:H) formed by an ionized deposition method, which was one type of the plasma CVD, and a thickness was 1 μm. A refractive index of the coating layer 51a with respect to light of 365 nm wavelength was 2.09. As conditions for film formation of the coating layer 51a by the ionized deposition method, mixed gas of methane ($CH_4$) and acethylene ($C_2H_2$) was used as material gas, and the film was formed by applying a substrate bias of −6 kV. The coating layer 51b was a nitrogen doped hydrogenated amorphous-carbon (N doped a-C:H) formed by the ionized deposition method. In Examples 2-1, 2-2, and 2-3, the thickness of the coating layer 51b was 10 nm, 5 nm, and 20 nm, respectively. The refractive index of the coating layer 51b with respect to light of 365 nm wavelength was 2.12. The nitrogen concentration of the coating layer 51b obtained by depth analysis using the XPS fell within the range of 3.5 to 4.5%. As conditions for film formation of the coating layer 51b by the ionized deposition method, gas obtained by mixing methane ($CH_4$) and acethylene ($CH_2$) with nitrogen ($N_2$) was used as material gas, and the film was formed by applying a substrate bias of −6 kV.

Measurement results of surface resistivities of Examples 2-1 to 2-3 were obtained as follows.

Example 2-1: 2.0E9 Ω/sq
Example 2-2: 3.5E9 Ω/sq
Example 2-3: 1.2E9 Ω/sq

The substrate holding boards 1 of Examples 2-1 to 2-3 were exposed to ultraviolet light in a wavelength of 290 nm to 385 nm at 50 mW/cm2 in the air for 24 hours, and reflectivities before exposure and after exposure were measured. Results obtained by subtracting the reflectivity before exposure from the reflectivity after exposure were obtained as follows.

Example 2-1: −0.2%
Example 2-2: −0.1%
Example 2-3: −0.3%

Examples 2-4 to 2-6

Figure 9:
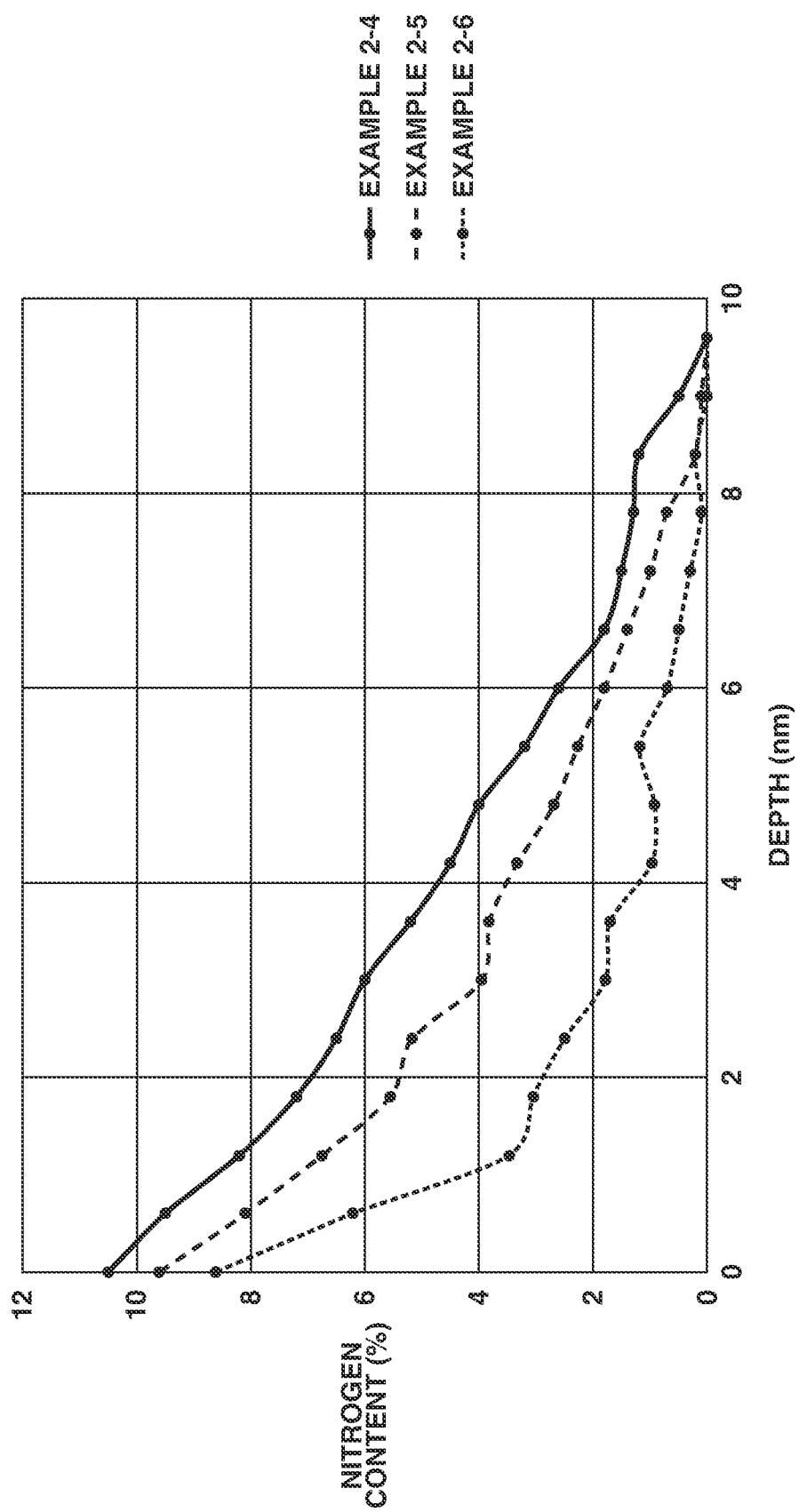
FIG. 9 illustrates a graph indicating measurement results of Examples.

The substrate holding boards 1 manufactured in Examples 2-4 to 2-6 will now be described with reference to FIGS. 6A, 6B, and 6C. Examples 2-4 to 2-6 are similar to Example 2-1 except that a layer provided on the coating layer 51a is the coating layer 51c. The coating layer 51c is hydrogenated amorphous carbon containing DLC in which a nitrogen concentration is inclined. FIG. 9 illustrates a result obtained by analyzing a nitrogen concentration of the coating layer 51c in a film thickness direction. As seen from FIG. 9, thicknesses of the coating layer 51c in Examples 2-4 to 2-6 were 7 nm, 8.5 nm, and 9.5 nm, respectively.

A nitrogen concentration of the surface of the coating layer 51c was 8 at % or larger and 11 at % or smaller. A refractive index of the coating layer 51c with respect to light of 365 nm wavelength was 2.11. The coating layer 51c was formed by implanting nitrogen ion to the surface of the coating layer 51a by a plasma ion implantation method using a device of the ionized deposition method. By inducing plasma using nitrogen gas and accelerating nitrogen ion in the plasma using a substrate bias, the nitrogen ion was caused to enter the surface on the substrate holding board 1. Substrate biases in Example 2-4, 2-5, and 2-6 were −8 kV, −6 kV, and −4 kV, respectively.

Measurement results of surface resistivities of Examples 2-4 to 2-6 were obtained as follows.

Example 2-4: 5.9E8 Ω/sq
Example 2-5: 7.0E8 Ω/sq
Example 2-6: 8.5E8 Ω/sq

The substrate holding boards 1 of Examples 2-4 to 2-6 were exposed to ultraviolet light in a wavelength of 290 nm to 385 nm at 50 mW/cm2 in the air for 24 hours, and reflectivities before exposure and after exposure were measured. Results obtained by subtracting the reflectivity before exposure from the reflectivity after exposure were obtained as follows.

Example 2-4: −0.1%
Example 2-5: −0.2%
Example 2-6: −0.2%

Example 2-7

The substrate holding board 1 manufactured in Example 2-7 will now be described with reference to FIG. 7. Example 2-7 is similar to Example 2-1 except that the coating layer 52 is formed on the coating layer 51b. The coating layer 52 was hydrogenated amorphous carbon (a-C:H) formed by the ionized deposition method, and a thickness was 50 nm. A refractive index of the coating layer 52 with respect to light of 365 nm wavelength was 1.98. As conditions for film formation of the coating layer 52 by the ionized deposition method, mixed gas of methane ($CH_4$) and acethylene ($C_2H_2$) was used as material gas, and the film was formed by applying a substrate bias of −3 kV. The reason why a refractive index of the coating layer 52 is lower than a refractive index of the coating layer 51b lies in that acceleration caused by a substrate bias is weak.

A reflectivity in Example 2-7 was 6.3%. In contrast, a reflectivity in Example 2-1 was 7.4%. Thus, an effect of reducing a reflectivity by 1.1% was obtained by using the coating layer 52. The surface resistivity in Example 2-7 was 4.5E9 Ω/sq. The substrate holding board 1 of Example 2-7 was exposed to ultraviolet light in a wavelength of 290 nm to 385 nm at 50 mW/cm$^2$ in the air for 24 hours, and reflectivities before exposure and after exposure were measured. A result obtained by subtracting the reflectivity before exposure from the reflectivity after exposure was −0.1%.

Comparative Example 2-1

In Comparative Example 2-1, the substrate holding board 1 was manufactured by forming a film of nitrogen doped hydrogenated amorphous carbon (N doped a-C:H) with a thickness of 1 μm by an ionized deposition method on the same base material as that in Example 2-1. The film formation method was a method used under the same condition as the film formation condition of the coating layer 51b in Example 2-1 except for a change in thickness.

The surface resistivity in Comparative Example 2-1 was 8.2E8 Ω/sq. The substrate holding board 1 of Comparative Example 2-1 was exposed to ultraviolet light in a wavelength of 290 nm to 385 nm at 50 mW/cm² in the air for 24 hours, and reflectivities before exposure and after exposure were measured. A result obtained by subtracting the reflectivity before exposure from the reflectivity after exposure was −0.5%.

Comparative Example 2-2

Comparative Example 2-2 is similar to Example 1 except that the coating layer 51b is removed. More specifically, a film of hydrogenated amorphous carbon (a-C:H) was formed with a thickness of 1 μm on a base material by an ionized deposition method. The film formation method was the same as that of the coating layer 51a in Example 2-1.

The surface resistivity in Comparative Example 2-2 was 8.3E9 Ω/sq. The substrate holding board 1 of Comparative Example 2-2 was exposed to ultraviolet light in a wavelength of 290 nm to 385 nm at 50 mW/cm² in the air for 24 hours, and reflectivities before exposure and after exposure were measured. A result obtained by subtracting the reflectivity before exposure from the reflectivity after exposure was −0.1%.

Measurement results of surface resistivities and changes in reflectivity that were obtained for the substrate holding boards in Examples and Comparative Examples are shown in Table 2.

TABLE 2

|  | Coating layer 51a | Coating layer 51b/ Coating layer 51c | Coating layer 52 |
|---|---|---|---|
| Example 2-1 | a-C:H | N doped a-C:H | — |
| Example 2-2 | a-C:H | N doped a-C:H | — |
| Example 2-3 | a-C:H | N doped a-C:H | — |
| Example 2-4 | a-C:H | N ion-implanted a-C:H | — |
| Example 2-5 | a-C:H | N ion-implanted a-C:H | — |
| Example 2-6 | a-C:H | N ion-implanted a-C:H | — |
| Example 2-7 | a-C:H | N doped a-C:H | a-C:H |
| Comparative Example 2-1 | N doped a-C:H | — | — |
| Comparative Example 2-2 | a-C:H | — | — |

|  | Surface resistivity (Ω/sq) | Reflectivity change in ultraviolent exposure (%) |
|---|---|---|
| Example 2-1 | 2.0E+09 | −0.2 |
| Example 2-2 | 3.5E+09 | −0.1 |
| Example 2-3 | 1.2E+09 | −0.3 |
| Example 2-4 | 5.9E+08 | −0.1 |
| Example 2-5 | 7.0E+08 | −0.2 |
| Example 2-6 | 8.5E+08 | −0.2 |
| Example 2-7 | 4.5E+09 | −0.1 |
| Comparative Example 2-1 | 8.2E+08 | −0.5 |
| Comparative Example 2-2 | 8.3E+09 | −0.1 |

Evaluation of Examples and Comparative Example

In Examples 2-1 to 2-7, it was possible to obtain the substrate holding board 1 having a low surface resistivity and a small change amount in reflectivity in ultraviolet exposure in addition to high abrasion resistance caused by DLC. In contrast to this, while a surface resistivity was low, a change amount in reflectivity in ultraviolet exposure was large in Comparative Example 2-1. In Comparative Example 2-2, while a change amount in reflectivity in ultraviolet exposure was small, a surface resistivity was high.

In these Examples and Comparative Examples, hydrogenated amorphous carbon was mainly used, but various types of DLC, such as tetrahedral amorphous carbon, can be used.

The exemplary embodiments described above can be appropriately changed without departing from the technical idea. The disclosure in this specification is not limited to the description in this specification, and the disclosure also includes all matters that can be recognized from this specification and the drawings attached to this specification.

As for exemplified specific numerical ranges, a range from e to f (e to f are numbers) means a value equal to or larger than e and equal to or smaller than f. As for exemplified specific numerical ranges, if a range from i to j and a range from m to n are parallelly given (i, j, m, and n are numbers), a pair of a lower limit and an upper limit is not limited to a pair of i and j or a pair of m and n.

For example, a plurality of pairs of lower limits and upper limits may be considered in combination. More specifically, in a case where a range from i to j and a range from m to n are parallelly given, consideration may be performed in the range from i to n or consideration may be performed in the range from m to j without producing contradiction. In addition, a value e or larger means a value equal to e or larger than e (exceeding e), and a value larger than e may be employed without employing e. In addition, a value f or smaller means a value equal to f or smaller than f (less than f), and a value smaller than f may be employed without employing f.

The disclosure in this specification includes a complementary set of individual concepts described in this specification. More specifically, if "A is larger than B" is described in this specification, for example, even if the description "B is not larger than A" is omitted, this specification is assumed to disclose that "B is not larger than A". This is because, in a case where "A is larger than B" is described, a case where "B is not larger than A" is assumed to be considered.

The disclosure of the present invention will be given below.

(Configuration 1)

A substrate holding board including a first layer, and a second layer forming an interfacial surface with the first layer, wherein the first layer and the second layer contain diamond-like carbon, wherein a refractive index of the first layer in a wavelength is higher than a refractive index of the second layer in the wavelength, and wherein the second layer is formed on the first layer.

(Configuration 2)

The substrate holding board according to Configuration 1, wherein a hydrogen content of the second layer is 10 at % or larger and smaller than 50 at %.

(Configuration 3)

The substrate holding board according to any one of Configuration 1 or 2, wherein the second layer is hydrogenated amorphous-carbon (a-C:H).

(Configuration 4)

A substrate holding board including a first layer, and a second layer forming an interfacial surface with the first layer, wherein the first layer contains diamond-like carbon, and the second layer contains a silicon carbide, wherein a refractive index of the first layer in a wavelength is higher than a refractive index of the second layer in the wavelength, and wherein the second layer is formed on the first layer.
(Configuration 5)
The substrate holding board according to Configuration 4, wherein a silicon content of the first layer is smaller than a silicon content of the second layer.
(Configuration 6)
The substrate holding board according to any one of Configurations 1 to 5, wherein a hydrogen content of the first layer is smaller than 10 at %.
(Configuration 7)
The substrate holding board according to any one of Configurations 1 to 6, wherein the first layer is tetrahedral amorphous-carbon (ta-C).
(Configuration 8)
The substrate holding board according to Configuration 4, wherein a hydrogen content of the first layer is 10 at % or larger and smaller than 50 at %.
(Configuration 9)
The substrate holding board according to Configuration 4 or 8, wherein the first layer is hydrogenated amorphous-carbon (a-C:H).
(Configuration 10)
A substrate holding board including a first layer, and a second layer forming an interfacial surface with the first layer, wherein the first layer contains diamond-like carbon having a hydrogen content smaller than 10 at %, wherein the second layer contains diamond-like carbon having a hydrogen content of 10 at % or larger and smaller than 50 at %, and wherein the second layer is formed on the first layer.
(Configuration 11)
The substrate holding board according to any one of Configurations 1 to 10, wherein a topmost surface of the substrate holding board is formed by the second layer.
(Configuration 12)
The substrate holding board according to any one of Configurations 1 to 11, wherein a reflectivity of the second layer is 10% or smaller.
(Configuration 13)
The substrate holding board according to any one of Configurations 1 to 12, wherein a distance from the second layer to a topmost surface of the substrate holding board is smaller than a thickness of the first layer.
(Configuration 14)
The substrate holding board according to any one of Configurations 1 to 13, wherein a hydrogen content of the first layer is smaller than a hydrogen content of the second layer.
(Configuration 15)
A substrate holding board including base materials including a first layer including material containing diamond-like carbon that is provided on a side of a topmost surface of the substrate holding board at least among the base materials, and a second layer including material containing diamond-like carbon having a higher nitrogen content than a nitrogen content of the first layer that is provided directly on the first layer, wherein a thickness of the second layer is 5 nm or larger and 200 nm or smaller.
(Configuration 16)
The substrate holding board according to Configuration 15, wherein the thickness of the second layer is 5 nm or larger and 30 nm or smaller.
(Configuration 17)
The substrate holding board according to Configuration 15 or 16, wherein the first layer includes a portion having a nitrogen content of 1 at % or smaller, and the second layer includes a portion having a nitrogen content larger than 1 at %.
(Configuration 18)
The substrate holding board according to Configuration 17, wherein the second layer includes a portion having a nitrogen content of 3 at % or larger.
(Configuration 19)
The substrate holding board according to any one of Configurations 15 to 18, wherein a nitrogen content of the second layer becomes lower toward a side of the first layer from a side of the second layer that is opposite to the first layer.
(Configuration 20)
A substrate holding board including base materials including a first layer including material containing diamond-like carbon that is provided on a side of a topmost surface of the substrate holding board at least among the base materials, and a second layer including material containing diamond-like carbon having a higher nitrogen content than a nitrogen content of the material that is provided directly on the first layer, wherein the nitrogen content of the second layer becomes lower toward a side of the first layer from a side of the second layer that is opposite to the first layer.
(Configuration 21)
The substrate holding board according to Configuration 19 or 20, wherein the second layer includes a portion having a nitrogen content of 5 at % or larger and 30 at % or smaller, and a portion having a nitrogen content of 3% or smaller.
(Configuration 22)
The substrate holding board according to any one of Configurations 15 to 21, further including a third layer on a side of the second layer that is opposite to a side of the first layer, wherein a refractive index of the third layer is lower than a refractive index of the second layer.
(Configuration 23)
The substrate holding board according to Configuration 22, wherein a topmost surface of the substrate holding board is formed by the third layer.
(Configuration 24)
The substrate holding board according to any one of Configurations 1 to 23, wherein at least one of an interfacial surface between the first layer and the second layer, and the topmost surface is a rough surface having an arithmetic average roughness Ra of 0.4 μm or larger and 4.0 μm or smaller.
(Configuration 25)
The substrate holding board according to any one of Configurations 1 to 24, wherein a thickness of the first layer is larger than a thickness of the second layer.
(Configuration 26)
A substrate holding board including a first layer, and a second layer formed directly on the first layer, wherein the first layer and the second layer contain diamond-like carbon including hydrogen or nitrogen, and wherein a hydrogen content of the first layer is smaller than a hydrogen content of the second layer, or a nitrogen content of the first layer is smaller than a nitrogen content of the second layer.
(Manufacturing Method 1)
A manufacturing method of a device including placing a substrate on the substrate holding board according to any one of Configurations 1 to 26, and exposing the substrate.
(Manufacturing Method 2)
The manufacturing method of a device according to Manufacturing Method 1, wherein the substrate includes a sapphire substrate.
(Manufacturing Method 3)

A method of manufacturing the substrate holding board according to any one of Configurations 15 to 26, the manufacturing method including forming the second layer by implanting nitrogen ion to a layer including material containing diamond-like carbon.

(Manufacturing Method 4)

The manufacturing method according to Manufacturing Method 3, wherein the nitrogen ion is implanted using a plasma ion implantation method.

(Device 1) An exposure device including the substrate holding board according to any one of Configurations 1 to 26, a light source, an optical system configured to expose a substrate to light emitted from the light source, and a moving unit configured to move the substrate holding board.

(Device 2)

The exposure device according to Device 1, wherein the optical system includes a transmission-type lens.

(Device 3)

The exposure device according to Device 2, wherein the optical system is of a reflection type that uses a mirror.

According to an exemplary embodiment of the present disclosure, it is possible to provide a technique advantageous in improving peel resistance of a substrate holding board while suppressing a reflectivity on the surface of the substrate holding board.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2021-175764, filed Oct. 27, 2021, and No. 2022-101149, filed Jun. 23, 2022, which are hereby incorporated by reference herein in their entirety.

What is claimed is:

1. A substrate holding board comprising:
   a base portion;
   a first layer forming an interfacial surface with the base portion or with a protruding portion on the base portion; and
   a second layer forming an interfacial surface with the first layer,
   wherein the first layer and the second layer contain diamond-like carbon,
   wherein a refractive index of the first layer in a wavelength is higher than a refractive index of the second layer in the wavelength, and
   wherein the second layer is formed on the first layer,
   wherein a hydrogen content of the first layer is smaller than a hydrogen content of the second layer.

2. The substrate holding board according to claim 1, wherein a hydrogen content of the second layer is equal to or larger than 10 at % and smaller than 50 at %.

3. The substrate holding board according to claim 1, wherein the first layer is tetrahedral amorphous-carbon (ta-C).

4. The substrate holding board according to claim 1, wherein a topmost surface of the substrate holding board is formed by the second layer.

5. An exposure device comprising:
   the substrate holding board according to claim 1;
   an optical system configured to expose a substrate to light; and
   a moving unit configured to move the substrate holding board.

6. The exposure device according to claim 5, wherein the optical system includes a transmission-type lens.

7. The exposure device according to claim 5, wherein the optical system is of a reflection type that includes a mirror.

8. A substrate holding board comprising:
   a base;
   a first layer formed directly on the base portion or directly on a protruding portion on the base portion; and
   a second layer formed directly on the first layer,
   wherein the first layer and the second layer contain diamond-like carbon including hydrogen or nitrogen,
   wherein a hydrogen content of the first layer is smaller than a hydrogen content of the second layer, or a nitrogen content of the first layer is smaller than a nitrogen content of the second layer.

9. The substrate holding board according to claim 8, wherein a nitrogen content of the first layer is smaller than a nitrogen content of the second layer, and a thickness of the second layer is equal to or larger than 5 nm and equal to or smaller than 200 nm.

10. The substrate holding board according to claim 9, wherein a thickness of the second layer is equal to or larger than 5 nm and equal to or smaller than 30 nm.

11. The substrate holding board according to claim 9, wherein the first layer includes a portion having a nitrogen content equal to or smaller than 1 at %, and the second layer includes a portion having a nitrogen content larger than 1 at %.

12. The substrate holding board according to claim 11, wherein the second layer includes a portion having a nitrogen content equal to or larger than 3 at %.

13. The substrate holding board according to claim 9, wherein a nitrogen content of the second layer becomes lower toward a side of the first layer from a side of the second layer that is opposite to the first layer.

14. The substrate holding board according to claim 9, further comprising a third layer on a side of the second layer that is opposite to a side of the first layer,
   wherein a refractive index of the third layer is lower than a refractive index of the second layer.

15. The substrate holding board according to claim 14, wherein a topmost surface of the substrate holding board is formed by the third layer.

16. The substrate holding board according to claim 15, wherein the third layer is formed directly on the second layer.

17. A method of manufacturing the substrate holding board according to claim 9, the manufacturing method comprising:
   forming the second layer by implanting nitrogen ion to a layer including a material containing diamond-like carbon, using a plasma ion implantation method.

18. An exposure device comprising:
   the substrate holding board according to claim 9;
   an optical system configured to expose a substrate to light; and
   a moving unit configured to move the substrate holding board.

19. The exposure device according to claim 18, wherein the optical system includes a transmission-type lens.

20. The exposure device according to claim 18, wherein the optical system is of a reflection type that includes a mirror.

* * * * *